United States Patent [19]

Kadokawa

[11] Patent Number: 4,937,829

[45] Date of Patent: Jun. 26, 1990

[54] ERROR CORRECTING SYSTEM AND DEVICE

[75] Inventor: Yuichi Kadokawa, Tokyo, Japan

[73] Assignee: Ricoh Company, Ltd., Tokyo, Japan

[21] Appl. No.: 185,079

[22] Filed: Apr. 22, 1988

[30] Foreign Application Priority Data

Apr. 24, 1987 [JP] Japan ................. 62-100169
May 1, 1987 [JP] Japan ................. 62-106393
Aug. 6, 1987 [JP] Japan ................. 62-195240

[51] Int. Cl.$^5$ ............................. G06F 11/10
[52] U.S. Cl. ................... 371/37.6; 371/37.1
[58] Field of Search ............ 371/37, 38, 39, 40, 371/37.1, 37.2, 37.6, 38.1, 39.1

[56] References Cited

U.S. PATENT DOCUMENTS

| | | | |
|---|---|---|---|
| 4,105,999 | 8/1978 | Nakamura | 371/37 |
| 4,162,480 | 7/1979 | Berlekamp | 371/37 |
| 4,494,234 | 1/1985 | Patel | 371/38 |
| 4,556,977 | 12/1985 | Olderdissen | 371/37 |
| 4,633,470 | 12/1986 | Welch | 371/37 |
| 4,637,021 | 1/1987 | Shenton | 371/37 |
| 4,754,458 | 6/1988 | Dornstetter | 371/37 X |

OTHER PUBLICATIONS

"On the Algorithm for Solving Yule-Walker Equation Based Upon Institute of Electronics and Communication Engineers of Japan".

Primary Examiner—Jerry Smith
Assistant Examiner—Robert W. Beausoliel
Attorney, Agent, or Firm—Oblon, Spivak, McClelland, Maier & Neustadt

[57] ABSTRACT

An error correcting system for obtaining an error location polynomial from a syndrome or an error pattern from an error location and a syndrome when decoding a long distance code, the error correcting system comprising steps of setting a data word $A_{(i+j-2)}$ to each element $q_{i,j}$ of a matrix consisting of p rows and (p+1) columns [where $1 \leq i \leq p$, $1 \leq j \leq p+1$ and $A_0$ to $A_{2p-1}$ denote a syndrome of an error location] performing left hand elementary transformation over the matrix, and obtaining the coefficient of each term of the polynomial.

7 Claims, 26 Drawing Sheets

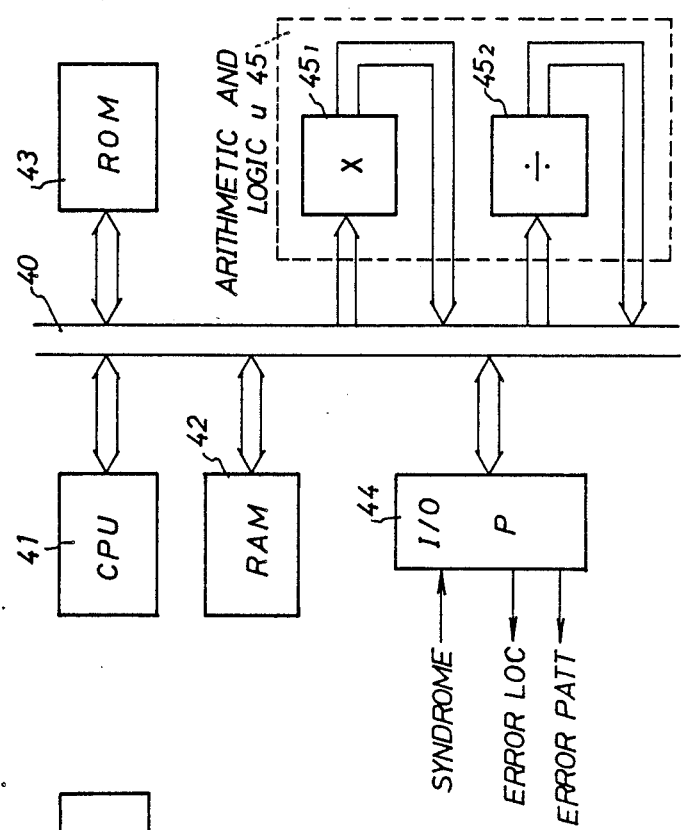
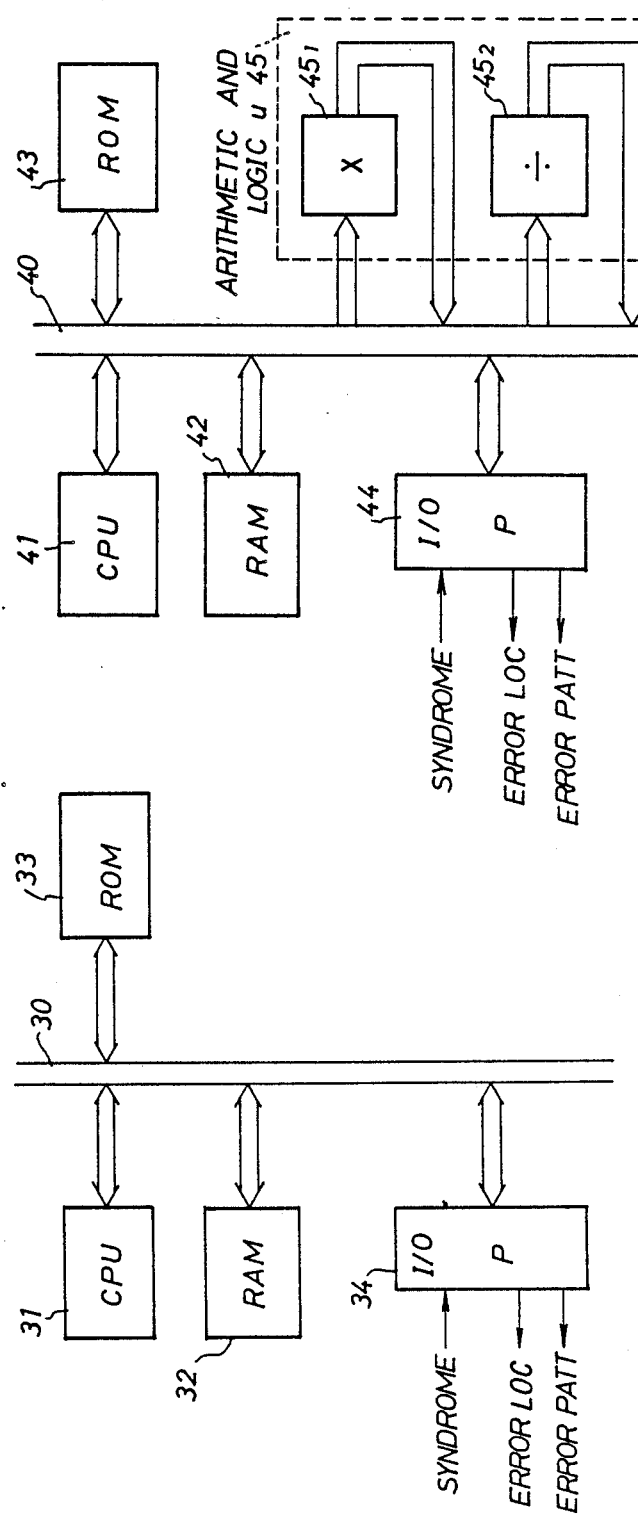

Fig.5 (i)
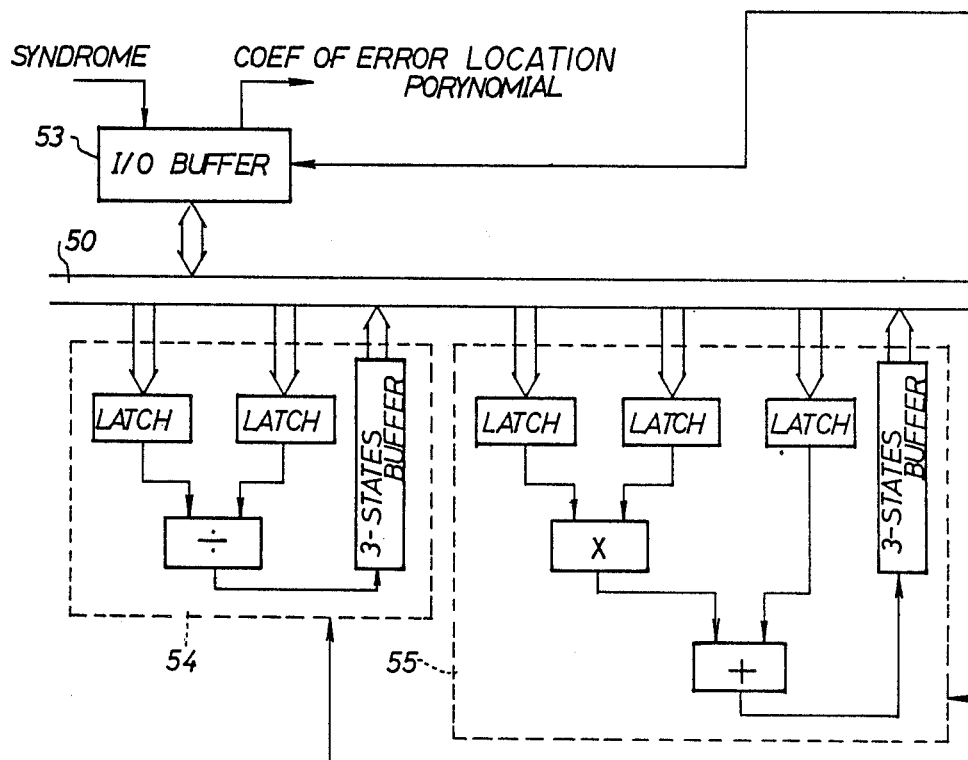
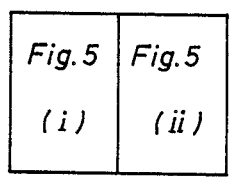
| Fig.5 | Fig.5 |
| (i) | (ii) |

FIG. 8(A)

| + | 0 | 1 | 2 | 3 | 4 | 5 | 6 | 7 | ... |
|---|---|---|---|---|---|---|---|---|---|
| 0 | 0 | 1 | 2 | 3 | 4 | 5 | 6 | 7 | |
| 1 | 1 | 0 | 3 | 2 | 5 | 4 | 7 | 6 | |
| 2 | 2 | 3 | 0 | 1 | 6 | 7 | 4 | 5 | |
| 3 | 3 | 2 | 1 | 0 | 7 | 6 | 5 | 4 | |
| 4 | 4 | 5 | 6 | 7 | 0 | 1 | 2 | 3 | |
| 5 | 5 | 4 | 7 | 6 | 1 | 0 | 3 | 2 | |
| 6 | 6 | 7 | 4 | 5 | 2 | 3 | 0 | 1 | |
| 7 | 7 | 6 | 5 | 4 | 3 | 2 | 1 | 0 | |
| 248 | 248 | 249 | 250 | 251 | 252 | 253 | 254 | 255 | |
| 249 | 249 | 248 | 251 | 250 | 253 | 252 | 255 | 254 | |
| 250 | 250 | 251 | 248 | 249 | 254 | 255 | 252 | 253 | |
| 251 | 251 | 250 | 249 | 248 | 255 | 254 | 253 | 252 | |
| 252 | 252 | 253 | 254 | 255 | 248 | 249 | 250 | 251 | |
| 253 | 253 | 252 | 255 | 254 | 249 | 248 | 251 | 250 | |
| 254 | 254 | 255 | 252 | 253 | 250 | 251 | 248 | 249 | |
| 255 | 255 | 254 | 253 | 252 | 251 | 250 | 249 | 248 | |

FIG. 8(B)

| x | 0 | 1 | 2 | 3 | 4 | 5 | 6 | 7 |
|---|---|---|---|---|---|---|---|---|
| 0 | 0 | 0 | 0 | 0 | 0 | 0 | 0 | 0 |
| 1 | 0 | 1 | 2 | 3 | 4 | 5 | 6 | 7 |
| 2 | 0 | 2 | 4 | 6 | 8 | 10 | 12 | 14 |
| 3 | 0 | 3 | 6 | 5 | 12 | 15 | 10 | 9 |
| 4 | 0 | 4 | 8 | 12 | 16 | 20 | 24 | 28 |
| 5 | 0 | 5 | 10 | 15 | 20 | 17 | 30 | 27 |
| 6 | 0 | 6 | 12 | 10 | 24 | 30 | 20 | 18 |
| 7 | 0 | 7 | 14 | 9 | 28 | 27 | 18 | 21 |
| ......... | | | | | | | | |
| 248 | 0 | 248 | 237 | 21 | 199 | 63 | 42 | 210 |
| 249 | 0 | 249 | 239 | 22 | 195 | 58 | 44 | 213 |
| 250 | 0 | 250 | 233 | 19 | 207 | 53 | 38 | 220 |
| 251 | 0 | 251 | 235 | 16 | 203 | 48 | 32 | 219 |
| 252 | 0 | 252 | 229 | 25 | 215 | 43 | 50 | 206 |
| 253 | 0 | 253 | 231 | 26 | 211 | 46 | 52 | 201 |
| 254 | 0 | 254 | 225 | 31 | 223 | 33 | 62 | 192 |
| 255 | 0 | 255 | 227 | 28 | 219 | 36 | 56 | 199 |

FIG. 8(C)

| | 0 | 1 | 2 | 3 | 4 | 5 | 6 | 7 |
|---|---|---|---|---|---|---|---|---|
| 0 | 0 | 1 | 2 | 3 | 4 | 5 | 6 | 7 |
| 1 | 0 | 1 | 2 | 3 | 4 | 5 | 6 | 7 |
| 2 | 0 | 142 | 1 | 143 | 2 | 140 | 3 | 141 |
| 3 | 0 | 244 | 245 | 1 | 247 | 3 | 2 | 246 |
| 4 | 0 | 71 | 142 | 201 | 1 | 70 | 143 | 200 |
| 5 | 0 | 167 | 83 | 244 | 166 | 1 | 245 | 82 |
| 6 | 0 | 122 | 244 | 142 | 245 | 143 | 1 | 123 |
| 7 | 0 | 186 | 105 | 211 | 210 | 104 | 187 | 1 |
| 8 | 0 | 173 | 71 | 234 | 142 | 35 | 201 | 100 |
| ......... | | | | | | | | |
| 248 | 0 | 66 | 132 | 198 | 21 | 87 | 145 | 211 |
| 249 | 0 | 212 | 181 | 97 | 119 | 163 | 194 | 22 |
| 250 | 0 | 232 | 205 | 37 | 135 | 111 | 74 | 162 |
| 251 | 0 | 117 | 234 | 159 | 201 | 188 | 35 | 86 |
| 252 | 0 | 127 | 254 | 129 | 225 | 158 | 31 | 96 |
| 253 | 0 | 255 | 227 | 28 | 219 | 36 | 56 | 199 |
| 254 | 0 | 126 | 252 | 130 | 229 | 155 | 25 | 103 |
| 255 | 0 | 253 | 231 | 26 | 211 | 46 | 52 | 201 |

FIG. 9

| α | 10 | α | 10 | α | 10 | α | 10 |
|---|---|---|---|---|---|---|---|
| 0 | 1 | 16 | 76 | 32 | 157 | 48 | 70 |
| 1 | 2 | 17 | 152 | 33 | 39 | 49 | 140 |
| 2 | 4 | 18 | 45 | 34 | 78 | 50 | 5 |
| 3 | 8 | 19 | 90 | 35 | 156 | 51 | 10 |
| 4 | 16 | 20 | 180 | 36 | 37 | 52 | 20 |
| 5 | 32 | 21 | 117 | 37 | 74 | 53 | 40 |
| 6 | 64 | 22 | 234 | 38 | 148 | 54 | 80 |
| 7 | 128 | 23 | 201 | 39 | 53 | 55 | 160 |
| 8 | 29 | 24 | 143 | 40 | 106 | 56 | 93 |
| 9 | 58 | 25 | 3 | 41 | 212 | 57 | 186 |
| 10 | 116 | 26 | 6 | 42 | 181 | 58 | 105 |
| 11 | 232 | 27 | 12 | 43 | 119 | 59 | 210 |
| 12 | 205 | 28 | 24 | 44 | 238 | 60 | 185 |
| 13 | 135 | 29 | 48 | 45 | 193 | 61 | 111 |
| 14 | 19 | 30 | 96 | 46 | 159 | 62 | 222 |
| 15 | 38 | 31 | 192 | 47 | 35 | 63 | 161 |

⋮

| α | 10 | α | 10 |
|---|---|---|---|
| 224 | 10 | 240 | 10 |
| 225 | 18 | 241 | 44 |
| 226 | 36 | 242 | 88 |
| 227 | 72 | 243 | 176 |
| 228 | 144 | 244 | 125 |
| 229 | 61 | 245 | 250 |
| 230 | 122 | 246 | 233 |
| 231 | 244 | 247 | 207 |
| 232 | 245 | 248 | 131 |
| 233 | 247 | 249 | 27 |
| 234 | 243 | 250 | 54 |
| 235 | 251 | 251 | 108 |
| 236 | 235 | 252 | 216 |
| 237 | 203 | 253 | 173 |
| 238 | 139 | 254 | 71 |
| 239 | 11 |  | 142 |
|  | 22 |  |  |

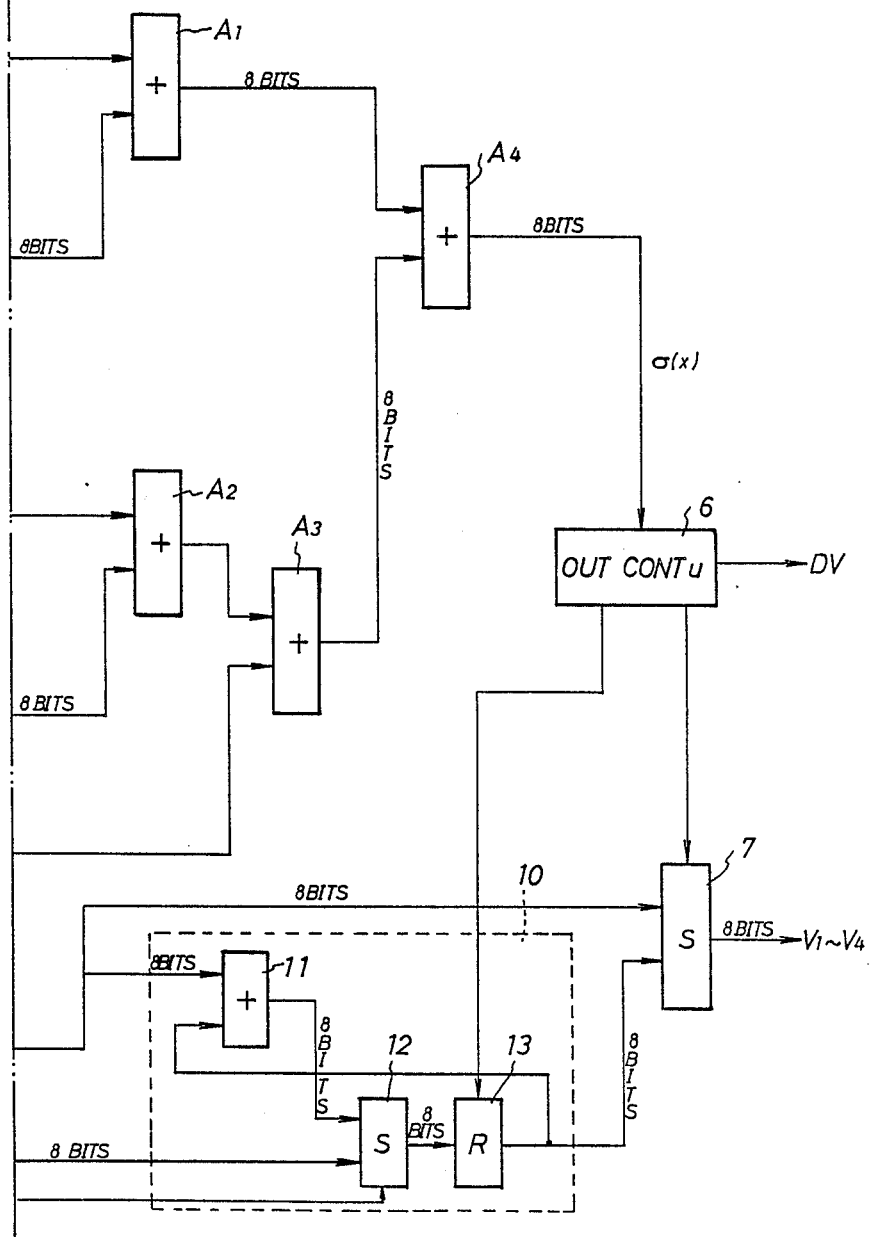

ERROR CORRECTING SYSTEM AND DEVICE

BACKGROUND OF THE INVENTION

The present invention relates to a system of and device for decoding and correcting many error-correctable codes (long distance code) at high speed in the correcting system.

Recording and reproducing of an optical disk or the like or the data transmission often employs data-coding and -decoding for correcting an error or errors included in a block consisting of many words such as 255 words by means of an error correcting code such as a BCH code or a Reed Solomon code.

In order to correct errors contained in many words by means of a BCH code or a Reed Solomon code, it is necessary to obtain coefficients of an error location polynomial on the basis of a syndrome generated from the received data.

Namely, this error location polynomial is a polynomial which has as a root a value corresponding with an error location. Thus, it is possible to calculate the location of the data containing an error by means of obtaining a coefficient of each term of an error location polynomial and by the Chien Algorithm.

This Chien Algorithm has a process of sequentially substituting elements except "0" of the Galois field used for correcting an error for an error location polynomial, obtaining the elements resulting in 0 which are as many as erroneous words and computing the error locations on these elements.

Accordingly, in an error correcting code for 4-word correction consisting of an extended Galois field $(2^8)$, if errors are caused at the locations corresponding with $\alpha^0$, $\alpha^1$, $\alpha^2$ and $\alpha^{254}$ of the GF $(2^8)$ elements $\alpha^0, \alpha^1, \ldots, \alpha^{254}$ except 0, the operation must be done for $\alpha^0$ to $\alpha^{254}$, that is, 255 times, so decoding has a shortcoming that it consumes too much time.

Heretofore, Peterson, Berlekamp Massey and Euclidean algorithms are well known as a system for obtaining coefficients of this type of error location polynomial. Yet, in the hardware arrangement, it is difficult to obtain practicable hardware due to very bulky arrangement. In the software arrangement, it has a problem of hard judgement, that is, slow processing speed.

SUMMARY OF THE INVENTION

An object of the present invention is to provide a system of and device for decoding the long distance code mentioned above at high speed and correcting an error when decoding the long distance code, the system and device as well as are suitable for hardware arrangement.

Another object of the present invention is to provide a system for reducing computing time for error locations and increasing decoding speed for an error correcting code much in case of decoding an error correcting code for correcting many words, such as a BCH code or a Reed Solomon code often employed in a recording and reproducing device or signal transmission.

The present invention provides an error correcting system for obtaining an error location polynomial from a syndrome or an error pattern from an error location and a syndrome when decoding a long distance code, said error correcting system comprising steps of:

setting a data word $A_{(i+j-2)}$ to each element $q_{i,j}$ of a matrix consisting of p rows and (p+1) columns [where $1 \leq i \leq p$, $1 \leq j \leq p+1$ and $A_0$ to $A_{2p-1}$ denote a syndrome or an error location];

performing left side fundamental transformation over said matrix; and obtaining said coefficient of each term of said polynomial.

The present invention provides also an error correcting device for obtaining a coefficient of each term of an error pattern of an error location polynomial from a syndrome when decoding a long distance code, said error correcting device comprising:

a memory $(M_{i,j})$ for storing each data word $A_{(i+j-2)}$ corresponding to each element $q_{i,j}$ of a matrix consisting of p rows and (p+1) columns; and a computing means (C) with Galois field connected to an input and output bus (B) of said memory.

The error correcting system and device according to the present invention can obtain solutions of a matrix not by the immediate operation but by transformation of a matrix and the operation of the data words composing the matrix. Accordingly, it has an excellent effect that the process of obtaining solutions is very simple and is very rapid without excessively burdening the operation unit.

In particularly, if the error correcting device is arranged to concurrently process the elements in each row by providing an operating means for each row, this device consumes shorter processing time.

The present invention further provides an error correcting system for obtaining values corresponding to n error locations from an error location polynomial in case of decoding an error correcting code for correcting a plurality of errors, said error correcting system comprising steps of:

adding n−1 values corresponding to n−1 error locations which are obtained from said error location polynomial to a coefficient which is obtained from said polynomial and forms an added value of n values corresponding to n error locations by means of a computing means;

obtaining n−1 values corresponding to n−1 error locations from said polynomial;

adding said n−1 values to a coefficient which is obtained from said polynomial and forms an added value of n values corresponding to n error locations; and computing nth value corresponding to nth error location.

The error correcting system according to the present invention detects error locations less than correctable words n by 1 is number and computes the remaining 1 error location on the error locations and coefficients of an error location polynomial. Thus, an expected value of operation times is reduced to (n−1)/n on the operation of the conventional Chien Algorithm, so that an error correcting code can be decoded at high speed.

The present invention provides further an error correcting device for obtaining an error location polynomial from a syndrome or an error pattern from an error location and a syndrome when decoding a long distance code by steps of setting a data word $A_{(i+j-2)}$ to each element $a_{i,j}$ of a matrix consisting of p rows and (p+1) columns [where $1 \leq i \leq p$, $1 \leq j \leq p+1$ and $A_0$ to $A_{2p-1}$ denote a syndrome or an error location], performing left side fundamental transformation over said matrix, and obtaining a coefficient of said polynomial, said error correcting device comprising a computing means and a buffer register provided respectively in every row of a memory for respectively storing data words $A_{(i+j-2)}$ corresponding to each elements $a_{i,j}$ in matrix consisting of p rows and (p+1) columns so as to concurrently process data words contained in each column said buffer register being adapted for replacing data words with each other in each column.

The error correcting device according to the present invention is arranged to transform elements in each row concurrently, that is, one column as a block at a time by providing a computing means for each row without obtaining solutions of a matrix expression. Thus, it does not burden the arithmetic and logic unit too excessively and reduces the processing time remarkably.

BRIEF DESCRIPTION OF THE DRAWINGS

FIGS. 4, 5i, 5ii, 6i and 6ii are diagrams showing the embodiment of the error correcting device of the present invention;

FIGS. 8a-8c shows examples of an operation table;

FIG. 9 is a table showing the correspondence between the multiplication expression on a Galois field and the decimal expression;

DESCRIPTION OF THE PREFERRED EMBODIMENT

Figures 1A, 1B:
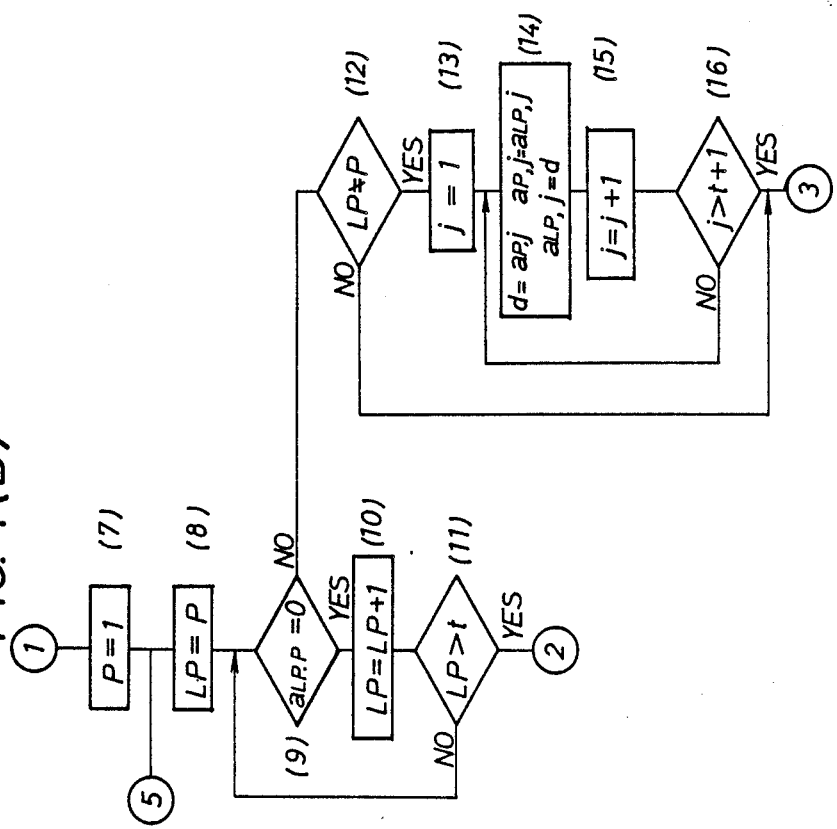
FIGS. 1a-1d is a flowchart for obtaining coefficients of an error location polynomial by means of the error correcting system of the system invention.

The arrangement of the present invention is described on the basis of the embodiment which is applied to the Reed Solomon code of 256 original Galois field GF ($2^8$) for correcting 4 words of a block consisting of 255 words, each of which consists of 8 bits.

The Reed Solomon code is decoded in accordance with the following five steps:

(1) obtaining a syndrome from the received data
(2) obtaining an error location polynomial from this syndrome
(3) obtaining an error location from this error location polynomial
(4) obtaining an error pattern from an error location
(5) correcting an error on the basis of the error location and the error pattern The present invention provides a decoding system which obtains computation of an error location polynomial from the syndrome mentioned in (2) as well as that of an error pattern from the error location mentioned in (4) at high speed by means of the same processing system.

The operation described below (+denotes an addition, ×denotes a multiplication and / denotes a division) means the operation of Galois field. In general, it is executed with reference to the table. As one example of the table, FIG. 8 illustates a part of the above-mentioned operation table formed modulo $G_{(x)}=x^8+x^4+x^3+x^2+1$ on GF ($2^8$). In addition, FIG. 8(a) denotes an addition table. FIG. 8(b) denotes a multiplication table. FIG. 8(c) denotes a division table, where the uppermost line is a dividend and the leftmost column is a divisor.

Assuming that each word value of the received data containing an error is $r_0$ to $r_{254}$, the received data R(x) is given by the following (1) expression:

$$R(x) = r_0 x^{254} + r_1 x^{253} + \ldots + r_{253} x^1 + r_{254} \quad (1)$$

The syndromes $S_0$ to $S_7$ generated from this received data are obtained by substituting $\alpha^1, \alpha^2, \ldots \alpha^7$ for x in that (1) expression:

$$
\begin{aligned}
S_0 = R(\alpha^0) &= r_0 + r_1 + \ldots + r_{253} + r_{254} \\
S_1 = R(\alpha^1) &= r_0 \alpha^{254} + r_1 \alpha^{253} + \ldots + r_{253} \alpha^1 + r_{254} \\
S_2 = R(\alpha^2) &= r_0 \alpha^{254\cdot 2} + r_1 \alpha^{253\cdot 2} + \ldots + r_{253} \alpha^{1\cdot 2} + r_{254} \\
&\ldots \\
&\ldots \\
&\ldots \\
S_7 = R(\alpha^7) &= r_0 \alpha^{254\cdot 7} + r_1 \alpha^{253\cdot 7} + \ldots + r_{253} \alpha^{1\cdot 7} + r_{254}
\end{aligned}
\quad (2)
$$

In case of the 4-word correction, assuming as $V_1$ to $V_4$ the elements $\alpha^0$ to $\alpha^{254}$ (hereinafter, referred to as an error location) of GF ($2^8$) showing error locations, the error location polynomial $\sigma(x)$ is defined as follows:

$$
\begin{aligned}
\sigma(x) \quad & (x + V_1)(x + V_2)(x + V_3) \\
& (x + V_4) \\
= \; & x^4 + \sigma_3 x^3 + \sigma_2 x^2 + \sigma_1 x + \sigma_0
\end{aligned}
\quad (3)
$$

As mentioned above, $V_1$ to $V_4$ denote an error location, that is, a word location containing a error. They respectively correspond with a power of x in the (1) expression. In general, the word location expressing in decimal system is obtained with reference to a table. As an example of this table, FIG. 9 illustrates a part of a table showing the correspondence between the power expression of $\alpha$ formed modulo $G_{(x)}=x^8+x^4+x^3+x^2+1$ on GF ($2^8$), analogously to the operation table shown in FIG. 8.

According to this table, for instance, when V=1, $\alpha^0 \doteq 1$ means the lowermost term of $r_{254}$. When V=4, $\alpha^2=4$ means the term of $r_{252}$.

Furthermore, this embodiment employs 8 types of syndromes $S_0$ to $S_7$. 8 unknowns expressing four error locations and four error patterns can be computed by means of these 8 types of syndromes. Yet, if the error patterns are obtained at first, it may become impossible to compute an error location in case of containing the same values, that is, the same error patterns. As a results, in general, an error location should be obtained at first.

In addition, this error location ranges from 0 to 254 (8 bits in binary system) since it is one of 255 word locations. As the error pattern, 255 types of patterns exist from "00000001" to "11111111". The error is corrected by adding this pattern to the word in which an error is detected.

The relation between each value of coefficients $\sigma_0$ to $\sigma_3$ in the (3) expression of the error location polynomial is estabilshed as follows:

$$\begin{pmatrix} S_3 & S_2 & S_1 & S_0 \\ S_4 & S_3 & S_2 & S_1 \\ S_5 & S_4 & S_3 & S_2 \\ S_6 & S_5 & S_4 & S_3 \end{pmatrix} \cdot \begin{pmatrix} \sigma_3 \\ \sigma_2 \\ \sigma_1 \\ \sigma_0 \end{pmatrix} = \begin{pmatrix} S_4 \\ S_5 \\ S_6 \\ S_7 \end{pmatrix} \quad (4)$$

The (4) expression is made to be the following (5) expression by transposing the right side term to the left side and then transforming the matrix.

$$\begin{pmatrix} S_0 & S_1 & S_2 & S_3 & S_4 \\ S_1 & S_2 & S_3 & S_4 & S_5 \\ S_2 & S_3 & S_4 & S_5 & S_6 \\ S_3 & S_4 & S_5 & S_6 & S_7 \end{pmatrix} \cdot \begin{pmatrix} \sigma_0 \\ \sigma_1 \\ \sigma_2 \\ \sigma_3 \\ 1 \end{pmatrix} = 0 \quad (5)$$

$\sigma_0$ to $\sigma_3$ are obtained as shown in the following (7) by multiplying both sides of this (5) expression by a matrix A from the left hand and then transforming it to the following (6) expression:

$$\begin{pmatrix} 1 & 0 & 0 & 0 & a_0 \\ 0 & 1 & 0 & 0 & a_1 \\ 0 & 0 & 1 & 0 & a_2 \\ 0 & 0 & 0 & 1 & a_3 \end{pmatrix} \cdot \begin{pmatrix} \sigma_0 \\ \sigma_1 \\ \sigma_2 \\ \sigma_3 \\ 1 \end{pmatrix} = 0 \quad (6)$$

$$\sigma_0 = a_0 \quad (7)$$
$$\sigma_1 = a_1$$
$$\sigma_2 = a_2$$
$$\sigma_3 = a_3$$

The matrix A by which both sides are multiplied for transforming the (5) expression into the (6) one has a right side value of 0, so that it may be any matrix. After all, what is required is to perform the left side fundamental transformation by which the matrix consisting of $S_0$ to $S_7$ shown in the (5) expression is transformed to the (6) expression.

This left side fundamental transformation will be concretely described below, assuming that the $S_0$ to $S_7$ values are 0, 15, 85, 115, 193, 115, 161 and 231.

The first term in the left side of the (5) expression is represented by the following (8) expression.

$$\begin{pmatrix} 0 & 15 & 85 & 115 & 193 \\ 15 & 85 & 115 & 193 & 115 \\ 85 & 115 & 193 & 115 & 161 \\ 115 & 193 & 115 & 161 & 231 \end{pmatrix} \quad (8)$$

At the first phase of transforming this (8) expression into the (6) one, the first column of the (8) expression is transformed into:

$$\begin{pmatrix} 1 \\ 0 \\ 0 \\ 0 \end{pmatrix}$$

of the first column of the first term in the left side of the (6) expression.

Since the value in the first column and first row is 0, the first row must be replaced with the first column in any row havin any value except 0. Thus, the first row is replaced with the second row. The resulting expression is the following (9) expression:

$$\begin{pmatrix} 15 & 85 & 115 & 193 & 115 \\ 0 & 15 & 85 & 115 & 193 \\ 85 & 115 & 193 & 115 & 161 \\ 115 & 193 & 115 & 161 & 231 \end{pmatrix} \quad (9)$$

Next, in order to change the value 15 in the first column and first row to 1, there is performed the Galois field operation which means that the value in each column of the first row is divided by 15. The resulting expression is the following (10) one:

$$\begin{pmatrix} 1 & 15 & 107 & 36 & 107 \\ 0 & 15 & 85 & 115 & 193 \\ 85 & 115 & 193 & 115 & 161 \\ 115 & 193 & 115 & 161 & 231 \end{pmatrix} \quad (10)$$

Next, the values in the third and the fourth rows of the first column must be changed to 0. So, with regard to the third row, the values in the first row is multiplied by 85 and then the resulting ones are Galois field-added to respective values in the third row. With regard to the fourth row, the values in the first row is multiplied by 115 and then the resulting ones are Galois field-added to respective values in the fourth row. The resulting expression is the following (11) one:

$$\begin{pmatrix} 1 & 15 & 107 & 36 & 107 \\ 0 & 15 & 85 & 115 & 193 \\ 0 & 87 & 58 & 72 & 90 \\ 0 & 58 & 14 & 182 & 154 \end{pmatrix} \quad (11)$$

At the second phase of transforming the above-mentioned (8) expression into the (6) expression format, the second column of the (11) expression must be:

$$\begin{pmatrix} 0 \\ 1 \\ 0 \\ 0 \end{pmatrix}$$

which is identical to the second column of the first term in the left side of the (6) expression. Like the same procedure with the above, the second row is multiplied by 15 and added to the first row. Next, the resulting values in the second row are multiplied by 87 and then are Galois field-added to respective values in the third row.

Furthermore, the values in the second row are multiplied by 58 and are Galois field-added to respective values in the fourth row. The resulting expression is the following (12) one:

$$\begin{pmatrix} 1 & 0 & 62 & 87 & 170 \\ 0 & 1 & 15 & 107 & 36 \\ 0 & 0 & 0 & 101 & 41 \\ 0 & 0 & 101 & 0 & 97 \end{pmatrix} \quad (12)$$

Next, at the third phase of transforming the above-mentioned (8) expression into the (6) one, the third column of the (12) expression must be:

$$\begin{pmatrix} 0 \\ 0 \\ 1 \\ 0 \end{pmatrix}$$

which is identical to the third column of the first term in the left side of the (6) expression. Like the first phase, the third row containing the value of 0 in the third column is replaced with the fourth row, resulting in:

$$\begin{pmatrix} 1 & 0 & 62 & 87 & 170 \\ 0 & 1 & 15 & 107 & 36 \\ 0 & 0 & 101 & 0 & 97 \\ 0 & 0 & 0 & 101 & 41 \end{pmatrix} \quad (13)$$

The third row is Galois field-divided by 101 in the third column and the resulting values in the third row are multiplied by 62 and then are Galois field-added to respective values in the first row. Further, the values in the third row are multiplied by 15 and then are Galois field-added to respective values in the second row. The resulting expression is the following (14) one:

$$\begin{bmatrix} 1 & 0 & 0 & 87 & 122 \\ 0 & 1 & 0 & 107 & 11 \\ 0 & 0 & 1 & 0 & 54 \\ 0 & 0 & 0 & 101 & 41 \end{bmatrix} \quad (14)$$

Next, at the final phase of transforming the above-mentioned (8) expression into the (6) expression, the fourth column of the (14) expression must be:

$$\begin{bmatrix} 0 \\ 0 \\ 0 \\ 1 \end{bmatrix}$$

which is identical to the fourth column of the first term in the left side of the (6) expression. The fourth row is Galois field-divided by 101 in the fourth column. The resulting values in the fourth row are multiplied by 87 and then are Galois field-added to respective values in the first row. Furthermore, the resulting values therein are multiplied by 107 and then are Galois field-added to respective values in the second row. As a result, the following (15) expression:

$$\begin{bmatrix} 1 & 0 & 0 & 0 & 64 \\ 0 & 1 & 0 & 0 & 120 \\ 0 & 0 & 1 & 0 & 54 \\ 0 & 0 & 0 & 1 & 15 \end{bmatrix} \quad (15)$$

which is identical to the (6) expression can be obtained.

Accordingly, as described above with regard to the expression (6), $$\sigma_0 = 64$$

$$\sigma_1 = 120$$

$$\sigma_2 = 54$$

$$\sigma_3 = 15 \quad (16)$$

are obtained. These $\sigma$ values are susbstituted in the error location polynomial shown in the (3) expression, resulting in;

$$x^4 + 15x^3 + 54x^2 + 120x + 64 \quad (17)$$

The roots of this (17) expression solved by the Chien Algorithm or the like mean the error locations. The roots of this case are;

$$x = 1, 2, 4, 8 \quad (18)$$

As a result, as mentioned above, the terms $r_{254}$, $r_{253}$, $r_{252}$ and $r_{251}$ or the (1) expression are found to be errors.

As mentioned above, the error location is detected. Now, the method for detecting an error pattern, that is, a correct data pattern will be described. $Y_1$ denotes an error pattern of an error location $V_1$, $Y_2$ denotes an error pattern of an error location $V_2$. That is, the error locations $V_1$, $V_2$, $V_3$ and $V_4$ are respectively assumed to correspond with the error patterns $Y_1$, $Y_2$, $Y_3$ and $Y_4$.

In this case, there is provided the following relation among the error patterns $Y_1$ to $Y_4$, the error positions $V_1$ to $V_4$ and the syndromes $S_0$ to $S_3$:

$$\begin{bmatrix} 1 & 1 & 1 & 1 \\ V_1 & V_2 & V_3 & V_4 \\ V_1^2 & V_2^2 & V_3^2 & V_4^2 \\ V_1^3 & V_2^3 & V_3^3 & V_4^3 \end{bmatrix} \cdot \begin{bmatrix} Y_1 \\ Y_2 \\ Y_3 \\ Y_4 \end{bmatrix} = \begin{bmatrix} S_0 \\ S_1 \\ S_2 \\ S_3 \end{bmatrix} \quad (19)$$

Like the transformation from the (4) expression to the (5) one, the right side term of this (19) expression is transposed to the left side and then the transposed matrix is changed to another format, resulting in the following (20) expression:

$$\begin{bmatrix} 1 & 1 & 1 & 1 & S_0 \\ V_1 & V_2 & V_3 & V_4 & S_1 \\ V_1^2 & V_2^2 & V_3^2 & V_4^2 & S_2 \\ V_1^3 & V_2^3 & V_3^3 & V_4^3 & S_3 \end{bmatrix} \cdot \begin{bmatrix} Y_1 \\ Y_2 \\ Y_3 \\ Y_4 \\ 1 \end{bmatrix} = 0 \quad (20)$$

As the error locations, $V_1 = 1$, $V_2 = 2$, $V_3 = 4$, $V_4 = 8$, $S_0 = 0$, $S_1 = 15$, $S_2 = 85$ and $S_3 = 115$ are respectively substituted in the left-hand matrix in the left side of this

(20) expression. Then, like the description of the (8) expression or the (15) one, the left side dundamental transformation is performed over the substituted matrix. As a result, it is transformed to the following (21) expression.

$$\begin{bmatrix} 1 & 0 & 0 & 0 & 1 \\ 0 & 1 & 0 & 0 & 1 \\ 0 & 0 & 1 & 0 & 1 \\ 0 & 0 & 0 & 1 & 1 \end{bmatrix} \quad (21)$$

According to the values of the fourth column, the error patterns $Y_1$ to $Y_4$ are assumed to have the following (22) expression:

$Y_1 = 1$ $Y_2 = 1$ $Y_3 = 1$ $Y_4 = 1 \quad (22)$

Thus, all the error patterns are detected to be 1, so that error-caused words, that is, $r_{254}$, $r_{253}$, $r_{252}$ and $r_{251}$, are to be corrected by the pattern 1.

Moreover, this error pattern Y value is a value representing its error pattern in decimal number. The above-mentioned error pattern 1 can be corrected just by adding "00000001" to the words at error locations by the Galois field.

As an example of errors, assuming the error locations to be the last three terms, that is, the error patterns $Y_1$ to $Y_3$, the following (23) expression is; Error location . . . Error pattern $$\begin{array}{l} V_1 = 1 \; Y_1 = 2 \; (\text{that is, "00000010"}) \\ V_2 = 2 \; Y_2 = 3 \; (\text{that is, "00000011"}) \\ V_3 = 4 \; Y_3 = 4 \; (\text{that is, "00000100"}) \end{array} \quad (23)$$

When these values are substituted in the matrix in the left-hand matrix in the left side of the (5) expression, the expression corresponding with the above-mentioned (8) one results in the following (24) expression:

$$\begin{bmatrix} 5 & 20 & 78 & 7 & 70 \\ 20 & 78 & 7 & 70 & 175 \\ 78 & 7 & 70 & 175 & 209 \\ 7 & 70 & 175 & 209 & 211 \end{bmatrix} \quad (24)$$

At the first phase of transforming this (24) expression, the first column is transformed to be;

$$\begin{bmatrix} 1 \\ 0 \\ 0 \\ 0 \end{bmatrix}$$

which is identical with the first column of the first term in the left side of the (6) expression. The resulting expression is the following (25) one:

$$\begin{bmatrix} 1 & 4 & 22 & 82 & 71 \\ 0 & 30 & 34 & 90 & 170 \\ 0 & 34 & 107 & 205 & 76 \\ 0 & 90 & 205 & 114 & 27 \end{bmatrix} \quad (25)$$

Next, the second column thereof is transformed to be;

$$\begin{bmatrix} 0 \\ 1 \\ 0 \\ 0 \end{bmatrix}$$

The resulting expression is the following (26) one:

$$\begin{bmatrix} 1 & 0 & 26 & 78 & 123 \\ 0 & 1 & 3 & 7 & 15 \\ 0 & 0 & 13 & 35 & 175 \\ 0 & 0 & 35 & 233 & 106 \end{bmatrix} \quad (26)$$

Next, the third column thereof is transformed to be;

$$\begin{bmatrix} 0 \\ 0 \\ 1 \\ 0 \end{bmatrix}$$

The resulting expression is the following (27) one:

$$\begin{bmatrix} 1 & 0 & 0 & 8 & 56 \\ 0 & 1 & 0 & 14 & 34 \\ 0 & 0 & 1 & 7 & 27 \\ 0 & 0 & 0 & 0 & 0 \end{bmatrix} \quad (27)$$

The fourth column of this (27) expression has all the values of 0 and $\sigma_3$ does not exist. Thus, an error is identified to have been caused in three words.

When an error is caused in three words, the error location polynomial corresponding with the (3) expression is represented in the following (28) expression:

$$\sigma(x) = (x+V_1)(x+V_2)(x+V_3) = x^3 + \sigma_2 x^2 + \sigma_1 x + \sigma_0 \quad (28)$$

The relational expression between the coefficients and the syndromes $S_0$ to $S_6$ is transformed to be the following (29) expression:

$$\begin{pmatrix} S_0 S_1 S_2 S_3 \\ S_1 S_2 S_3 S_5 \\ S_2 S_3 S_4 S_6 \end{pmatrix} \cdot \begin{pmatrix} \sigma_0 \\ \sigma_1 \\ \sigma_2 \\ 1 \end{pmatrix} = 0 \quad (29)$$

$\sigma_0$ to $\sigma_2$ can be obtained by performing left side fundamental transformation over this (29) expression. Yet, these values are obtained in the matrix consisting of three rows and four columns as shown in the upper left portion of the (27) expression. Namely, as shown in the values in the fourth column, those values are;

$\sigma_0 = 32.8$ $\sigma_1 = 14$ $\sigma_2 = 7$ \hfill (30)

The error location polynomial is represented by the following (31) expression).

$$x^3 + 7x^2 + 14x + 8 \quad (31)$$

And, the roots of this expression indicating the error location are;

$$x = 1, x = 2, x = 4 \quad (32)$$

Next, these values are substituted in the (19) expression for obtaining the error pattern. The (19) expression results in;

$$\begin{pmatrix} 1 & 1 & 5 \\ 1 & 2 & 4 & 20 \\ 1 & 4 & 16 & 78 \end{pmatrix} \cdot \begin{pmatrix} Y_1 \\ Y_2 \\ Y_3 \\ 1 \end{pmatrix} = 0 \quad (33)$$

The error pattern can be obtained by solving this (33) expression. As the other means, the matrix in the left-hand matrix in the left side of the (33) expression is transformed into the following (34) expression and then the following (35) expression can be obtained by transforming the (34) expression using the method applied when the above-mentioned error positions are obtained. This (35) expression is used for obtaining the error patterns shown in the (36) expression.

$$\begin{pmatrix} 1 & 1 & 1 & 5 & 0 \\ 1 & 2 & 4 & 20 & 0 \\ 1 & 4 & 16 & 78 & 0 \\ 0 & 0 & 0 & 0 & 0 \end{pmatrix} \quad (34)$$

$$\begin{pmatrix} 1 & 0 & 0 & 2 & 0 \\ 0 & 1 & 0 & 3 & 0 \\ 0 & 0 & 1 & 4 & 0 \\ 0 & 0 & 0 & 0 & 0 \end{pmatrix} \quad (35)$$

$$V_1 = 1, Y_1 = 2 \quad (36)$$
$$V_2 = 2, Y_2 = 3$$
$$V_3 = 4, Y_3 = 4$$

FIG. 1 is a flowchart for the operation procedure for obtaining an error location polynomial provided in case of extending the 4 words-correction as described above to the general t word(s)-correction.

In this flowchart, $S_0$ to $S_{2t-1}$ denote syndromes $a_{i,j}$ denote each element of the matrix shown in the following (40) expression.

$$\begin{pmatrix} a_{1,1} a_{1,2} a_{1,3} \ldots a_{1,t} a_{1,t+1} \\ a_{2,1} a_{2,2} a_{2,3} \ldots a_{2,t} a_{2,t+1} \\ \ldots \\ a_{t,1} a_{t,2} a_{t,3} \cdots a_{t,t} a_{t,t+1} \end{pmatrix} \quad (40)$$

FIG. 1(a) shows the process for substituting the values of the syndromes $S_0$ to $S_7$ in the matrix;

$$\begin{pmatrix} S_0 S_1 S_2 S_3 S_4 \\ S_1 S_2 S_3 S_4 S_5 \\ S_2 S_3 S_4 S_5 S_6 \\ S_3 S_4 S_5 S_6 S_7 \end{pmatrix} \quad (41)$$

of the first term in the left side of the (5) expression for each element $a_{i,j}$. At the step [1], the element $a_{i,j}$ in the upper left of this matrix is specified. At the step [2], the syndrome containing a subscript of $(i+j-2)$, that is, the syndrome $S_0$ containing a subscript of $(i+j-2)=(1+1-2)=0$ is substituted for this element. At the step [3], the element $a_{1,2}$ in the next column of the same row is specified. At the step [4], the number of elements in one row is assured to be less than, in this case, 5. Then, the program returns to the step [2], where the syndrome $S_1$ is substituted for this element $a_{1,2}$. Hereinafter, $S_2$ to $S_4$ are substituted for the elements, like the above, until the step [4] distinguishes that the substitution of syndromes for the elements is completed.

When the substitution for this row is completed, the judging result in the step [4] is y, so that at the step [4], the substitution for the next row, that is, the second row is performed from the elements $a_{2,1}$ to $a_{2,5}$ like the above. On completion of the substitution for $a_{2,5}$, the substitution is performed for the third row. In such process, the syndromes in the above-mentioned [40] expression are substituted for all the elements in 5 rows and 4 columns. The resulting matrix at the step 1, that is, the matrix provided after completing the substitution for all the elements and substituting the numerical values shown in the (8) expression for the values of respective elements, is described in the following (42) expression:

$$\begin{pmatrix} 0 & 15 & 85 & 115 & 193 \\ 15 & 85 & 115 & 193 & 115 \\ 85 & 115 & 193 & 115 & 161 \\ 115 & 193 & 115 & 161 & 231 \end{pmatrix} \quad (42)$$

In addition, the subscript $(i+j-2)$ of S to be set at the step [2] means the substitution of the same syndromes for the elements on a diagonal line.

FIG. 1(b) shows a flowchart for transforming the above-mentioned (42) expression to the following (43) expression corresponding with the (9) expression:

$$\begin{pmatrix} 15 & 85 & 115 & 193 & 115 \\ 0 & 15 & 85 & 115 & 193 \\ 85 & 115 & 193 & 115 & 161 \\ 115 & 193 & 115 & 161 & 231 \end{pmatrix} \quad (43)$$

At the step [7] shown in FIG. 1(b), the column number P is assumed as 1 so as to obtain [1000] of the first column. At the step [8], the row number is also assumed as 1 so as to specify the element $a_{i,j}$. At the step [9], if the value of the element is 0, 1 is added to the row number at the step [10]. Then, at the step [11], the program looks for the row not having a value of 0 at the element of the first column in the range from the first row to the lowermost row.

If it finds the row not having a value of 0 at the element of the first column, the program goes to the step [12]. If the row number is any value except the initial value P=1, that is, if the element in the first row and first column has a value of 0, at the step [13], the subscript showing the row number of the element is assumed as 1 so as to specify the element in the first column of the row to be changed to the first row. Then, in order to change the rows with each other, at the step [14], the element $a_{1,1}$ value is temporarily saved in a saving register d which includes storage capacity corresponding to one word. Further, the program substitutes for the element $a_{1,1}$ the element $a_{Lp,j}$ in the first column of the row to be changed because of including the row number LP detected in the steps [9] to [11] and then moves the element $a_{1,1}$ value saved in the saving register d to the element $a_{Lp,j}$.

At the step [15], this process is carried out from the first to the last column as the number increases. As a result, the (42) expression leads to the ③ state including the array of the (43) expression. Yet, if the value of the element $a_{1,1}$ in the first column of the first row is not originally 0 as shown in the (43) expression, it is not necessary to change them. Accordingly, the program can go directly from the step [12] to the ③ state.

At the steps [17] to [20] shown in FIG. 1(c), assuming as 1 the value of the element in the first column of the first row in the (43) expression, these steps process the division of respective element in the second column or later of this row by the element value in the first column of the first row. They consists of the flow for transforming the (43) expression into the above-mentioned (10) expression, which is again shown as a (44) expression:

$$\begin{pmatrix} 1 & 15 & 107 & 36 & 107 \\ 0 & 15 & 85 & 115 & 193 \\ 85 & 115 & 193 & 115 & 161 \\ 115 & 193 & 115 & 161 & 231 \end{pmatrix} \quad (44)$$

At the step [17], in order to specify the element in the second row, 1 is added to the row number P as the subscript showing the column. At the step [18], these elements are divided by the value of the element in the first column of the first row. This process continues until all the elements in this row are processed. As a result, the matrix shown in the (44) matrix is obtained.

The next steps [21] to [27] process each value in the first columns of the third and the fourth rows to be 0. The value in the first column of the third row is made to be 0 by respectively adding 85-fold element values in the first row to corresponding element values in the third row. Furthermore, the value in the first column of the fourth row is made to be 0 by respectively adding 115-fold element values in the first row to corresponding element values in the fourth row.

At the step [21], the element in the second column of the first row is specified. If i=P, it is unnecessary to perform the operation because this P row changes the value in this row into a desired value such as [1000]. Thus, in this case, the step [22] excludes the row. The step [23] processes the rows except that case.

The process of the step [23] is to multiply the value of the element in the ith column of the row P to be a desired value by the value in the Pth column of the Jth row and to add the element $a_{i,j}$ to the multiplied values. This process continues until the end of the row at the steps [24] and [25]. Upon completion of this process, the steps [26] and [27] perform the process of the next row.

As a result, in ④, the following (45) expression matrix, which has been already shown as the (11) expression, can be obtained:

$$\begin{pmatrix} 115107 & 36 & 107 \\ 015 & 85 & 115193 \\ 087 & 58 & 72 & 90 \\ 058 & 14 & 182154 \end{pmatrix} \quad (45)$$

In order to process change of the next column to a predetermined value, for example, change of the second column to [0100], the next step [28] adds 1 to the number of the column and then returns it to the step [8] as long as the unprocessed row remains.

Furthermore, 2 denotes a route provided in case the process has already become unnecessary in the step [11], that is, in case there exist few errors.

The matrix obtained by completing all the process in the first half of the step [30] is;

$$\begin{pmatrix} 1000 & 64 \\ 0100120 \\ 0010 & 54 \\ 0001 & 15 \end{pmatrix} \quad (46)$$

which has been shown as the (15) expression.

In order to obtain coefficients of an error location polynomial from this matrix, the step [30] sets 0 as an initial value of a subscript of this coefficient $\sigma$.

If 1 is added to this subscript, it is made to be a column number holding this coefficient, so that the step [31] sequentially reads out the value in the final column P=t by the process of the steps [31] to [33].

In addition, the step [34] provides a coefficient of the highest order term in the error location polynomial. This coefficient is always 1, so that it needs no operation.

FIG. 2 is a flowchart for the process of obtaining an error pattern. This flowchart shows only the different processing steps from those shown in FIG. 1. The steps marked with the same step number with FIG. 1 respectively do the same process. Further, the steps marked with the step number of FIG. 1 plus 100 respectively do the process corresponding with that of FIG. 1.

Figure 2A:
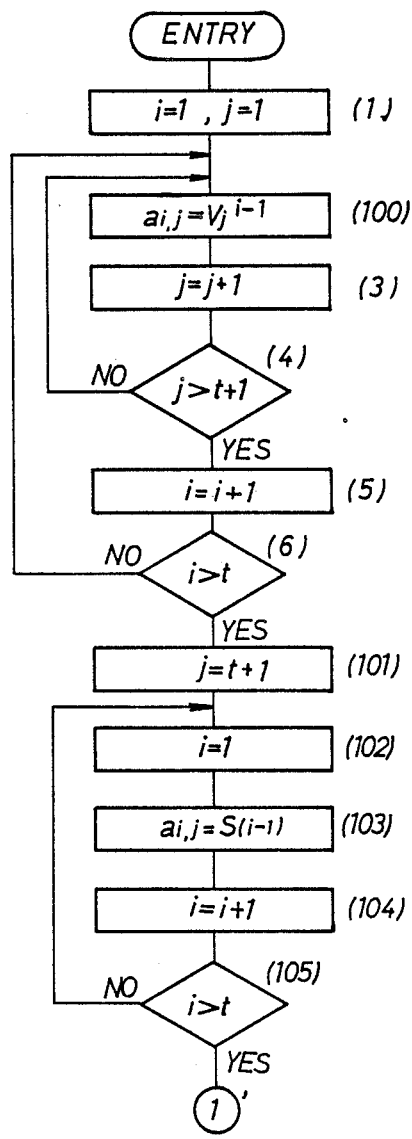
FIGS. 2a-2b is a modified flowchart for obtaining an error pattern by means of the embodiment of the error correcting system of the present invention.

FIG. 2(a) shows the process corresponding with FIG. 1(a). This process is to expand;

$$\begin{pmatrix} 1 & 1 & 1 & 1 & S_0 \\ V_1 & V_2 & V_3 & V_4 & S_1 \\ V_1^2 & V_2^2 & V_3^2 & V_4^2 & S_2 \\ V_1^3 & V_2^3 & V_3^3 & V_4^3 & S_3 \end{pmatrix} \quad (50)$$

It is different from the process in FIG. 1 in the respect of substituting error locations $V_j^{-1}$ for syndromes in the first column or the fourth column of the matrix in the step [2] and the syndromes $S_0$ to $S_i$ for the fifth column.

The step [100] is a step for substituting the error location for each element. The step [103] is a step for substituting the syndromes $S_0$ to $S_3$ in the fifth column for the corresponding elements. The matrix in ① provided on completion of the process in FIG. 2(a) is shown in the following (51) expression:

$$\begin{pmatrix} 1 & 1 & 1 & 1 & 0 \\ 1 & 2 & 4 & 8 & 15 \\ 1 & 4 & 16 & 64 & 85 \\ 1 & 8 & 64 & 58 & 115 \end{pmatrix} \quad (51)$$

Figure 1C:
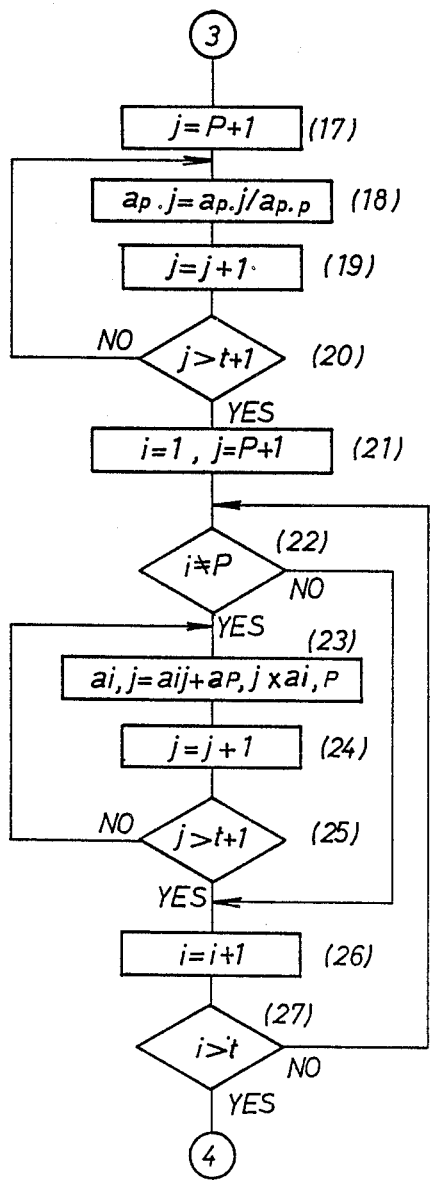
Figure 1D:
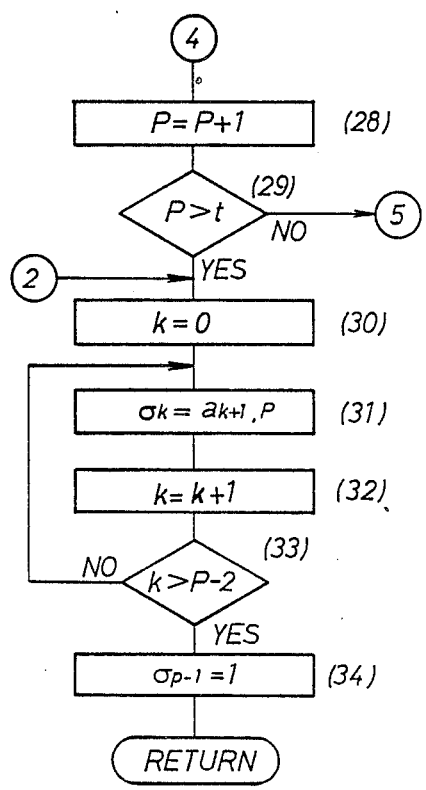
Figure 2B:
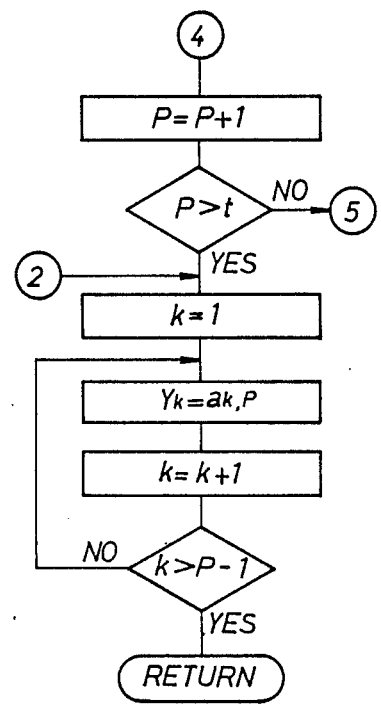

FIG. 2(b) corresponds with FIG. 1(d). The similar process to that in the step [7] or [27] shown in FIG. 1 has been executed over the matrix shown in the above-mentioned (51) expression, resulting in the matrix in the first half step ④' of the step [128], which is shown as follows:

$$\begin{pmatrix} 1 & 0 & 0 & 0 & 1 \\ 0 & 1 & 0 & 0 & 1 \\ 0 & 0 & 1 & 0 & 1 \\ 0 & 0 & 0 & 1 & 1 \end{pmatrix} \quad (52)$$

As described above with regard to the (21) expression, the first row to the fourth row of this [52] expression respectively denote error patterns corresponding with the error locations $Y_1$, $Y_2$, $Y_3$ and $Y_4$. In this case, all the error patterns are 1, that is, "00000001", so that the errors can be corrected by adding this "00000001" to the data word to be decoded on the error location.

FIGS. 3 to 6 respectively show the arrangement of the device for executing the error correcting system of the present invention.

The arrangement shown in FIG. 3 is the similar one to the conventional error correcting device. A CPU 31, a RAM 32, a ROM 33 and an I/O port 34 are respectively connected on a bus 30. The CPU 31 reads out the program and the table saved in the ROM 3 and then stores them in the RAM 32 so as to process the Galois field operation on the program and the table. The syndrome obtained from the received data word is input at the I/O port 34 and processed by the CPU 31. Then, the error location and the error pattern are respectively output at this I/O port 34, by which the decoded data word are corrected.

The arrangement shown in FIG. 3 has a shortcoming that the operation consumes long time and thus the processing speed is slow, because the CPU processes the Galois field operation.

FIG. 4 shows the embodiment of the present invention which is designed to overcome the above-mentioned shortcoming. A CPU 41, a RAM 42, a ROM 43 and an I/O port 44 are respectively connected on a bus 40. Furthermore, in this invention, there is provided a Galois field arithmetic and logic unit 45 including a Galois field multiplier $45_1$ and a Galois field divider $45_2$. Thus, this arithmetic and logic unit 45 executes the Galois field operations in the steps [14], [18] and [23] shown in the flowchart of FIG. 1, which are hard to be processed by the CPU, so that the processing speed becomes faster.

Figure 5:
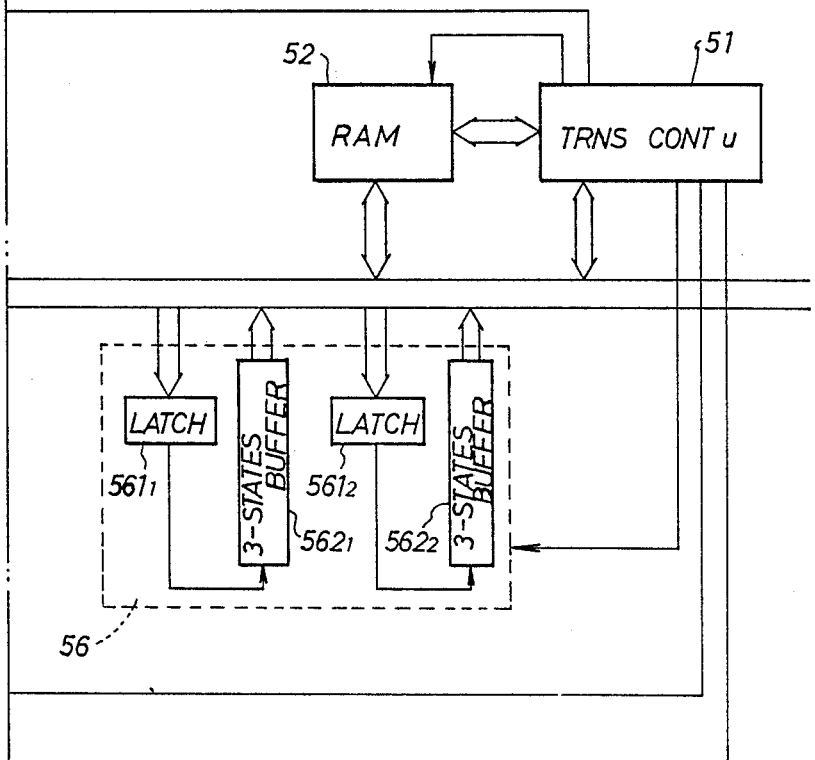

FIG. 5 shows a device for executing the operation of the flowchart shown in FIG. 1 mainly by the transfer. There are connected on a bus 50 a divider 54 for executing the division in the step [18], an arithmetic unit 55 for executing the multiplication and the division in the step [23] and a saving register 56 required for changing the data words in the step [14]. Furthermore, this bus 50 connects a RAM 52, an I/O port 53 and a transfer control unit 51 including a CPU for mainly executing the transfer control of data.

The divider 54 and the arithmetic unit 55 correspond to the arithmetic and logic unit 45 shown in FIG. 4. The saving register 56 provides two pairs of storage means consisting of latches $561_1$, $561_2$ and three states-buffers $562_1$, $562_2$. This register 56 stores two data words to be replaced in respective latches $561_1$ and $561_2$ and then sequentially reads out them so as to replace these data words with each other.

Figure 6I:
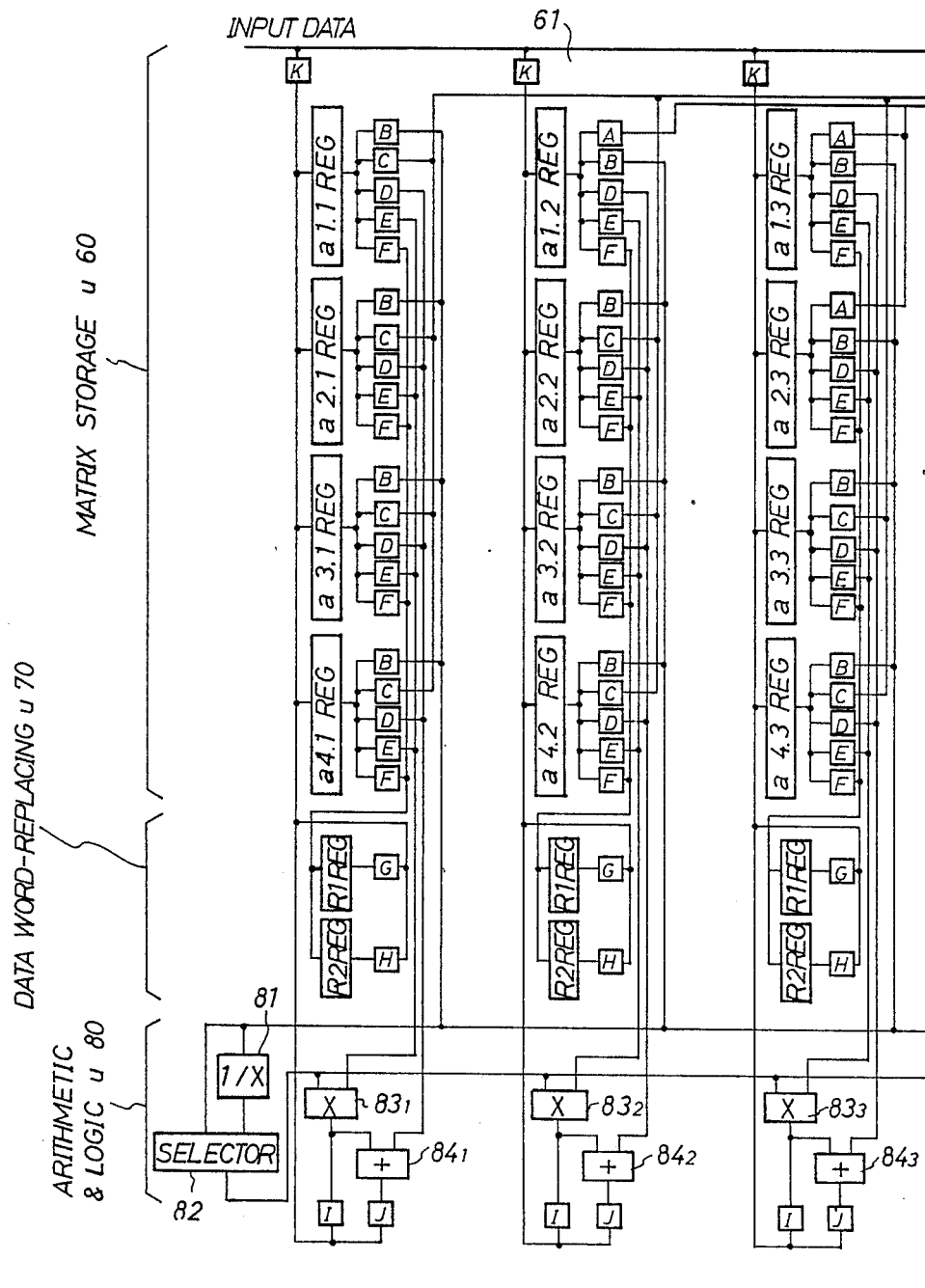
Figure 6:
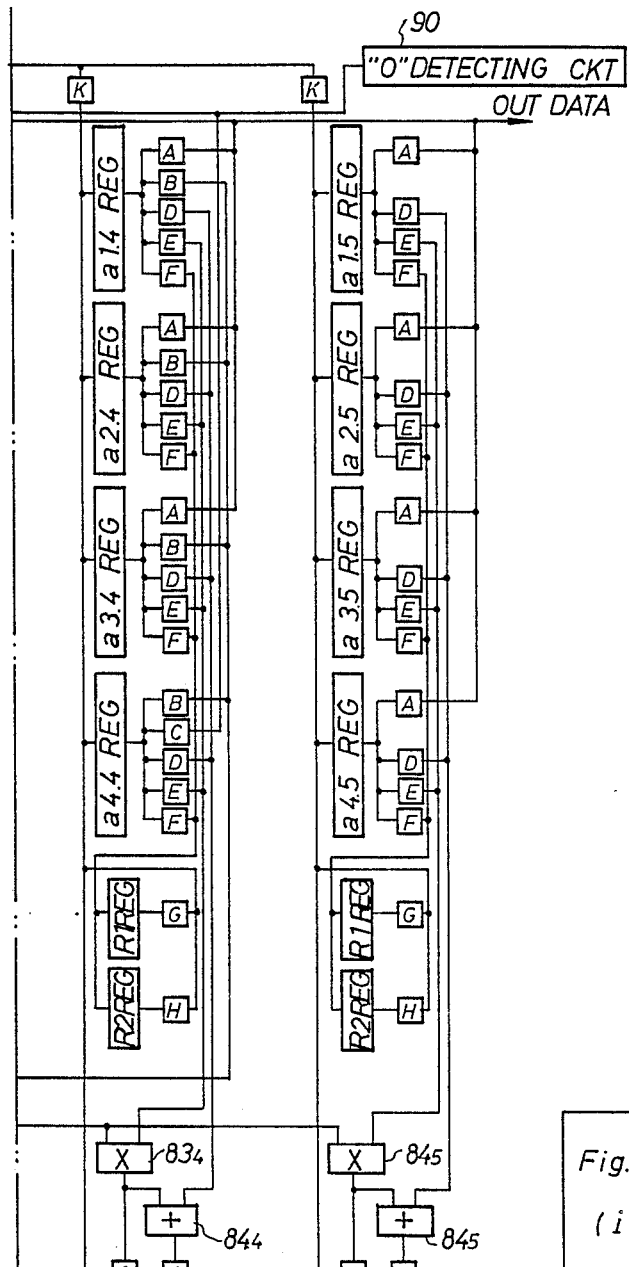

FIG. 6 shows the embodiment of an error correcting device for processing a 4 rows and 5 columns-arranged, that is, t=4 matrix. This device is invented in consideration of the respect that the error correcting system of the present invention is processed on the basis of the rows of the matrix. It is comprised of a matrix storage unit 60, a data word-replacing unit 70, an arithmetic and logic unit 80 and a 0-detecting unit 90. These marks A to H enclosed in □ mean the gates.

The operation of this embodiment is described on the flowchart shown in FIG. 7, considering as an example the case of processing the following matrix [60] of the first term in the left side of the above-mentioned [5] expression.

$$\begin{pmatrix} S_0 S_1 S_2 S_3 S_4 \\ S_1 S_2 S_3 S_4 S_5 \\ S_2 S_3 S_4 S_5 S_6 \\ S_3 S_4 S_5 S_6 S_7 \end{pmatrix} \quad (60)$$

The registers (R in FIG. 6) shown in 4 rows and 5 columns format are used for saving the data words of the elements corresponding with the above-mentioned matrix. These registers $a_{1,1}$ to $a_{4,5}$ respectively correspond with the locations of the elements in the matrix of the data words to be saved.

Figure 7A:
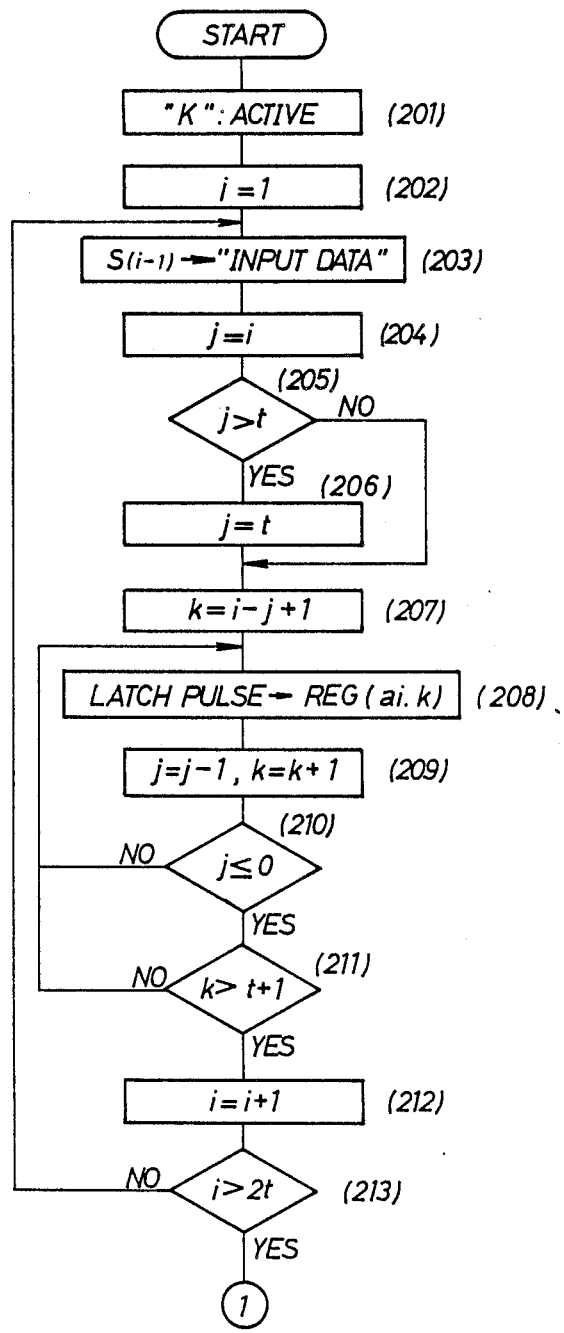
FIGS. 7a-7d is a flowchart for obtaining coefficient of an error location polynomial by means of the error correcting device shown in FIG. 6.

The steps [201] to [213] shown in FIG. 7(a) process substitution of the matrix values for these registers. At the step [201], an input gate K is in a conducting state. At the step [202], an initial value is set to 1. Then, at the step [203], a syndrome $S_{(i-1)}$, that is, $S_0$ are output on an input line 6.

Next, at the step [204], j is made identical to i, that is, 1 and the step [205] makes sure it is in the range of the row. Then, at the step [207], a subscript k is obtained and then the syndrome $S_0$ is saved in the $a_{j,k}$ register at the step [208].

The values of the elements $a_{1,2}$ and $a_{2,1}$ in the (60) expression are both the syndrome $S_1$ and the values of the elements $a_{1,3}$, $a_{2,2}$ and $a_{3,1}$ are all the syndrome $S_2$. Similarly, the same data word is substituted for elements on the oblique line till the syndrome $S_3$ to $S_7$, so that the process executed from the steps [201] to [208] selects the subscripts i and k of the register, a latch pulse is outputted to register for $a_{i,k}$ and then saves them in accordance with the process shown in the steps [204] to [208]. The process of the step [206] excludes the subscript generated to specify the element belonging to the row below the lowermost one.

The step [209] saves the syndrome S including a subscript plus 1 made at the step [212] in the element on the next oblique line by subtracting 1 from the row number and adding 1 to the column number. The steps [210], [211] and [213] exclude the selected subscript when there is no element to be specified by the subscript.

Figure 7B:
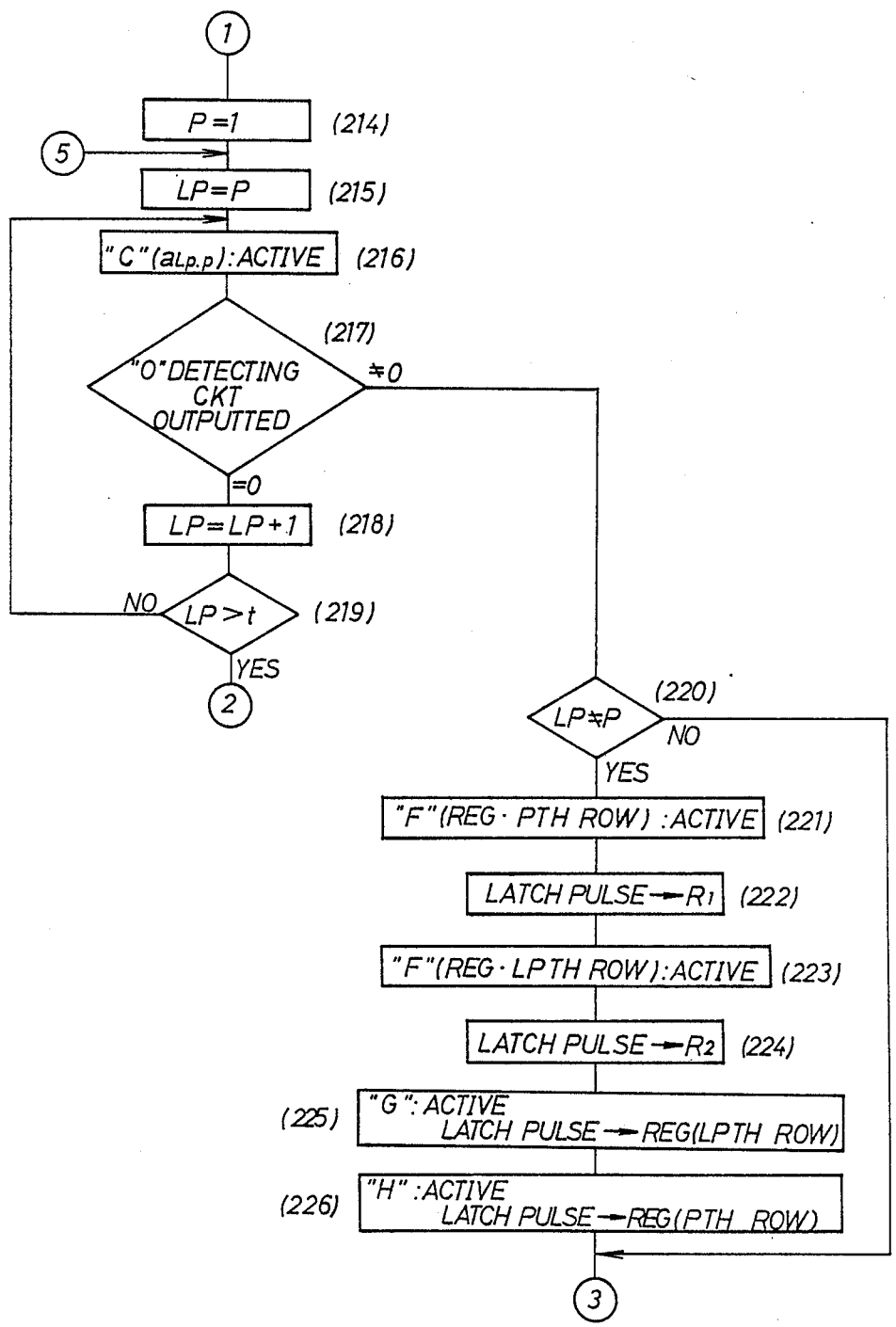

The steps [214] to [226] shown in FIG. 7(b) correspond to the process of FIG. 1(b). The steps [214] to [219] identifies whether the value of the data word is 0 or not. The steps [220] to [226] replace the rows with each other.

As an initial value, the step [214] sets 1 to the column number and the step [215] sets 1 to the row number so as to specify the register of $a_{1,1}$. The step [216] activates a gate C and the step [217] sends the data word saved in this register to the 0-detector 90 and identifies whether the value is 0 or not.

If the value is 0, the step [218] adds 1 to the row number, the step [219] makes sure that this row number exists in the matrix and the program returns to the step [216], which, as mentioned above about the transformation from the (8) expression to the (9) one, finds the row where the value of the element specified by the step [215] does not contain 0.

The step [220] determines whether the row is to be replaced or not. If it is not to be done, the matrix shown in the (9) expression is directly generated in ③. If it is to be done, this matrix is generated through the process of the steps [221] to [226].

These steps [221] to [222] activates the gate F belonging to the P row and outputs a latch pulse to the replacing register $R_1$. Further, they activate the gate F of the register in the LPth row and store the value of the register saving the data word to be replaced in this replacing register $R_1$. The next steps [223] to [224] store the value of the element to be replaced in the replacing register $R_2$ after outputting a latch pulse to $R_2$. Then, the steps [225] to [226] return the data words stored in the replacing registers $R_1$ and $R_2$ to other registers for saving the elements. As a result, the matrix shown in the (9) expression can be obtained.

This process is concurrently done in all the registers for one row, so that the replacement of a row does not need processing time for each element in the row.

Figure 7D:
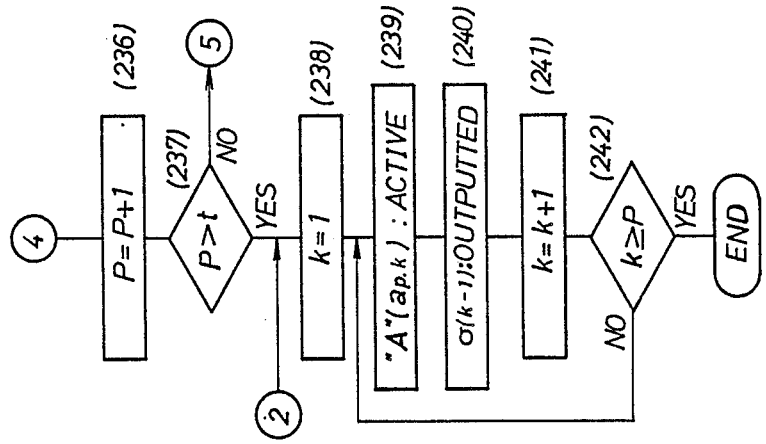
Figure 7C:
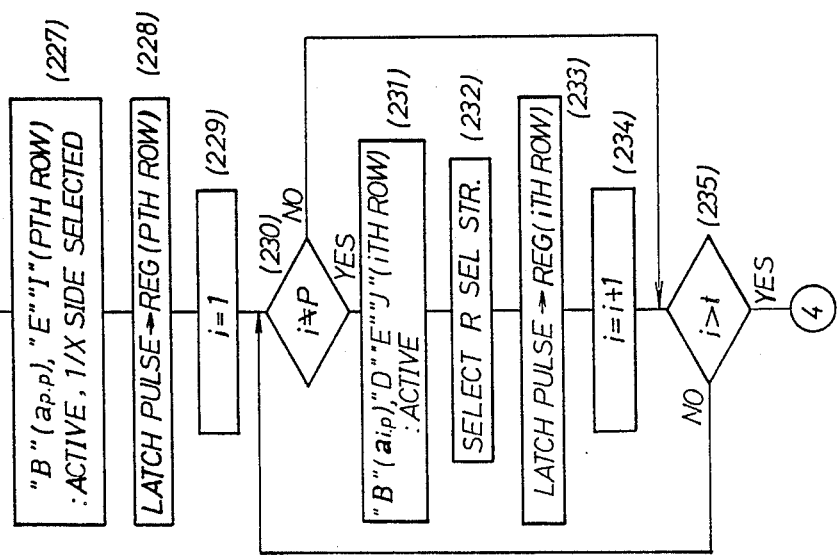

FIG. 7(c) is a flowchart for executing the process corresponding to that shown in FIG. 1(c). The step [227] switches a selector to supply the output of a reciprocal table 1/x to a multiplier x provided in each row and concurrently executes the division described in the step [19] of FIG. 1(c) for all the elements in one row. Then, the step [228] outputs a latch pulse to the registers for the pth row and writes the result into the original register.

The step [229] does the process of the step [22] shown in FIG. 1(c), that is, excludes the row in which the operation has already completed. Then, the steps [230] to [223] do the process corresponding with the [23] step, that is, outputs a latch pulse to registers in the ith row at the [233] step and transforms the (10) expression into the (11) one. Next, the step [234] specifies the next row and the step [235] makes sure the specified row exists in the matrix. This process is repeated for each row.

The gate B of the register $a_{i,p}$ is activated and then the value of the register is supplied to the arithmetic and logic unit 80. The selector 82 does switching to directly supply this value to one input terminals of the multipliers $83_1$ to $83_5$. The other input terminals of these multipliers receive the values saved in these registers applied from respective ones belonging to the i row through the gate E. Accordingly, the multiplication is concurrently done in each row. The resulting values are added to the values saved in respective registers supplied through the gate D and then are saved in respective registers in the ith row. In the final phase of this process, that is, 4, the matrix shown in the (11) expression is generated in each register of the matrix storage unit 60.

FIG. 7(d) corresponds with FIG. 1(d). The step [226] adds 1 to the column number. Then, the process of the step [215] or later is repeated. When the step [237] detects completion of the process of the last row, the above-mentioned matrix is generated in each register.

The process of the steps [238] to [242] shown in FIG. 7(d) is similar to that of the steps [30] to [34] shown in FIG. 1(d). Thus, this process is executed for sequentially obtaining coefficients of this error location polynomial. In addition, the coefficient of the term of the highest order in this error location polynomial is always 1, so that it is not always required to be computed, as mentioned above.

Moreover, the description about FIGS. 7 and 6 is directed to computation of coefficients of an error location polynomial. Yet, if, in the flow shown in FIG. 6(a), the data word to be stored in each register of the matrix storage unit 60 is assumed as a data word in the matrix of the first term in the left side of the (20) expression, an error pattern can be obtained by means of executing the identical process to that of obtaining the coefficients of the error location polynomial, as mentioned above.

The description mentioned above is relevant to a Reed Solomon code on GF ($2^8$), but the present invention is not limited by the Galois field. Further, it is obvious that this invention may be applied to the arrangement employing another long distance code such as a 6 adjacent code as a correction code.

In addition, it is also obvious that the error correcting device of this invention may be applied to the inverted matrix.

Next, a description will be directed to the embodiment wherein the arrangement of the error correcting system of the invention employs a Reed Solomon SOLOMON code (mentioned above) for 4-word correction of the Galois field ($2^8$). Namely the 4-word correction is executed over a received word train consisting of $2^8-1=255$ received words $r_0, r_1, \ldots, r_{254}$ including a parity. This invention improves the speed of the operation in the step (3) of the Reed Solomon code for obtaining an error location(s).

The received word train can be expressed in the polynomial shown below:

$$R(x) = r_0 x^{254} + r_1 x^{253} + \ldots r_{254} \quad (1)$$

Thus, the syndromes $S_0$ to $S_7$ are obtained as follows:

$$S_0 = R(\alpha^0) = r_0 + r_1 + \ldots + r_{254}$$

$$S_1 = R(\alpha^1) = r_0 \alpha^{254} + r_1 \alpha^{253} + \ldots + r_{254}$$

$$\vdots$$

$$S_7 = R(\alpha^7) = r_0 \alpha^{254 \times 7} + r_1 \alpha^{253 \times 7} + \ldots + r_{254}$$

In case of the 4-word correction, assuming as $V_1$ to $V_4$ the elements $\alpha^0$ to $\alpha^{254}$ (hereinafter, referred to as an error location) of GF($2^8$) showing error locations, the error location polynomial $\sigma(x)$ is;

$$\quad (2)$$

$$\sigma(x) = (x + V_1)(x + V_2)(x + V_3)(x + V_4)$$

$$= x^4 + \sigma_3 x^3 + \sigma_2 x^2 + \sigma_1 x + \sigma_0 \quad (3)$$

There is established the following relation between the coefficients $\sigma_3$ to $\sigma_0$ in respective terms shown in the expression (3):

$$\begin{bmatrix} S_3S_2S_1S_0 \\ S_4S_3S_2S_1 \\ S_5S_4S_3S_2 \\ S_6S_5S_4S_3 \end{bmatrix} \begin{bmatrix} \sigma_3 \\ \sigma_2 \\ \sigma_1 \\ \sigma_0 \end{bmatrix} = \begin{bmatrix} S_4 \\ S_5 \\ S_6 \\ S_7 \end{bmatrix} \quad (4)$$

If even one of the syndromes $S_0$ to $S_7$ has a value except 0, the error location polynomial $\sigma(x)$ is computed on these syndromes and the expression by means of the Peterson, Berlekamp Massey an Euclidean algorisms so as to obtain the coefficients $\sigma_3$ to $\sigma_0$ of respective terms in the expression (3). The corresponding $V_1$, $V_2$, $V_3$ and $V_4$ have error locations, that is, any value within the elements $\alpha^0$ to $\alpha^{254}$ except 0 on the Galois field $GF(2^8)$.

If errors are caused in $r_0$, $r_1$ and $r_{254}$, the V's have $\alpha^{254}$, $\alpha^{253}$ and $\alpha^0$. As mentioned above, sequentially substitute the elements $\alpha^0$ to $\alpha^{254}$ except 0 on the Galois field $GF(2^8)$ for the error location polynomial $\sigma(x)$ and, when $\alpha^{254}$, $\alpha^{253}$ and $\alpha^0$ are substituted therefor, $$\sigma(x)=0$$

is given to each element as is understood from the expression (3). Thus, these $\alpha$ are proved to be error locations.

Then, the expression (2) is expanded to be;

$$\begin{aligned}\sigma(x) &= (x + V_1)(x + V_2)(x + V_3)(x + V_4) \quad (5)\\ &= x^4 + (V_1 + V_2 + V_3 + V_4)x^3 + \\ &\quad (V_1V_2 + V_1V_3 + V_1V_4 + V_2V_3 + V_2V_4 + V_3V_4)x^2 + \\ &\quad (V_1V_2V_3 + V_1V_2V_4 + V_1V_3V_4 + V_2V_3V_4)x + \\ &\quad V_1V_2V_3V_4\end{aligned}$$

Comparing this expression (5) with the expression (3), $$\begin{aligned}\sigma_3 &= V_1 + V_2 + V_3 + V_4 \quad (6)\\ \sigma_2 &= V_1V_2 + V_1V_3 + V_1V_4 + V_2V_3 + V_2V_4 + V_3V_4\\ \sigma_1 &= V_1V_2V_3 + V_1V_2V_4 + V_1V_3V_4 + V_2V_3V_4\\ \sigma_0 &= V_1V_2V_3V_4\end{aligned}$$

is given. Thus, the expression (6) provides the following relation:

$$V_4 = V_1 + V_2 + V_3 + \sigma_3 \quad (7)$$

As a result, in case of the 4-word correction, the fourth error location can be obtained by these three error locations.

Accordingly, after the third error location is proved, it is not necessary to substitute the elements for the polynomial on the Chien Algorithm. If three error locations are detected at the outset of the received word train, the computing speed is remarkably increased.

Furthermore, if the error polynomial is transformed to;

$$\begin{aligned}\sigma(x) &= (1 + xV_1)(1 + xV_2)(1 + xV_3)(1 + xV_4)\\ &= \sigma_4'x^4 + \sigma_3'x^3 + \sigma_2'x^2 + \sigma_1'x + 1\end{aligned}$$

which is a dual expression to the expression (2), it gives the following expression of;

$$\sigma_1' = V_1 + V_2 + V_3 + V_4$$

that is, $$V_4 = V_1 + V_2 + V_3 + \sigma_1' \quad (8)$$

Thus, the expression (8) can be used in place of the expression (7).

Figure 10I:
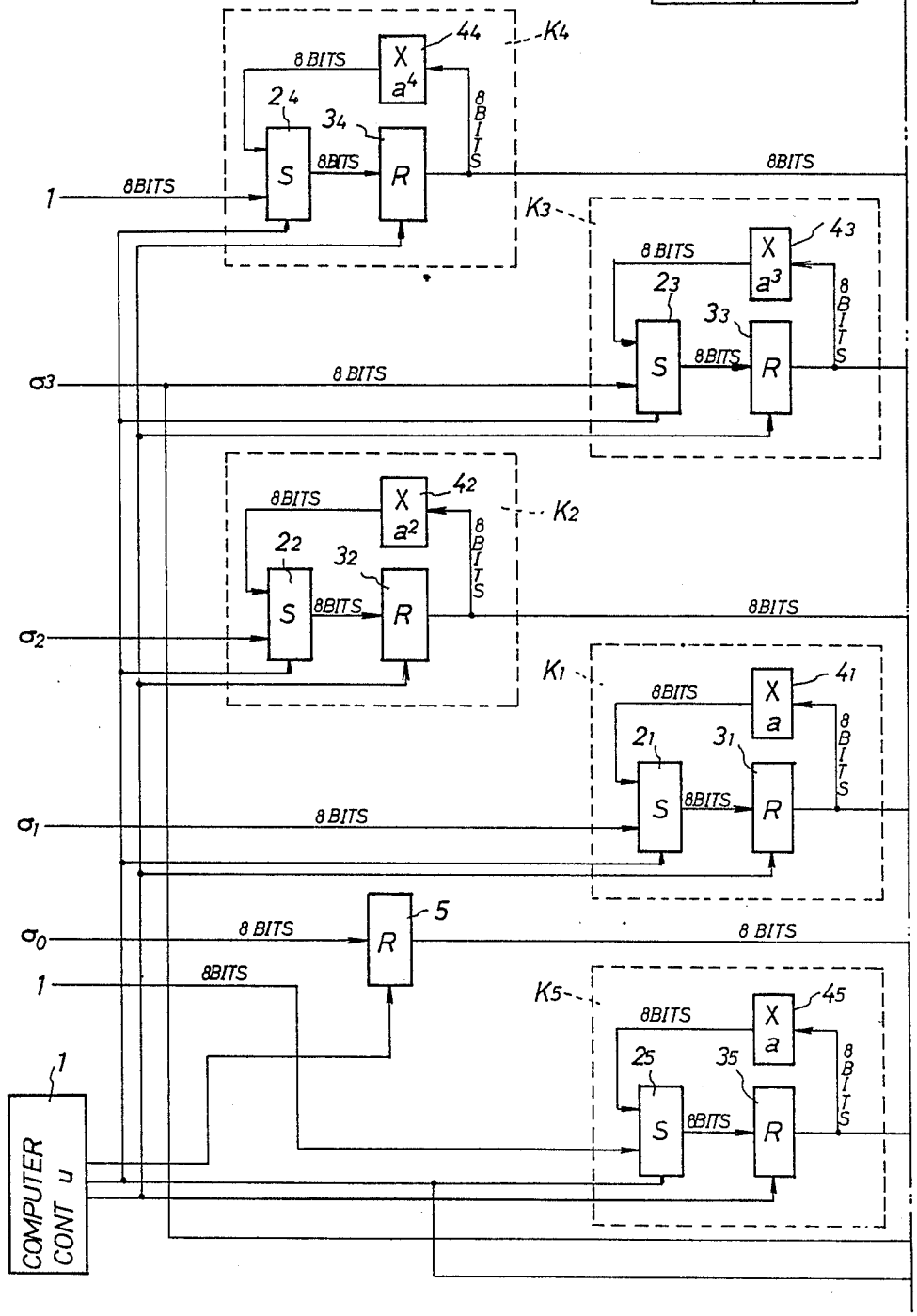
FIGS. 10i-10ii is a diagram showing an error location detecting circuit according to the embodiment of the error correcting and decoding system.

FIG. 10 is a diagram showing an embodiment of the circuit for obtaining error locations. This circuit if arranged to substitute the elements $\alpha^0$, $\alpha^1$, ... for the error location polynomial $\sigma(x)$ in sequence for obtaining three error locations and compute the fourth error location on the expression (7).

As shown in the diagram, four multiplier units $K_4$ to $K_1$ for computing the first to the fourth terms (four-to one-order terms) of the expression (3), respectively include a selector 2, a register 3 and a multiplier 4 connected in a loop.

In this multiplier unit $K_3$, if, at the outset of detecting error locations of a received data train, the coefficient $\sigma_3$ of the error location polynomial $\sigma(x)$ is entered to the register $3_3$ through the selector $2_3$ and then latched, this register $3_3$ outputs "$\sigma_3$" as a value of the second term provided in case of substituting $\alpha^0$ for $\sigma(x)$. Further, this "$\sigma_3$" is also supplied to the multiplier $4_3$ in which "$\sigma_3$" is multiplied by $\alpha^3$. Then the resulting value "$\sigma_3\alpha^3$" is applied to the register $3_3$ through the selector $2_3$ switched after input of $\sigma_3$.

When the clock signal supplied by the computer control unit 1 is applied to the register $3_3$, this register latches value "$\sigma_3\alpha^3$" supplied by the multiplier $4_3$ and outputs this value, that is, the second term for which "$\alpha_1$" is substituted, from the multiplier unit $K_3$.

Like this multiplier unit $K_3$, the other multiplier units $K_4$, $K_2$ and $K_1$ respectively output the values provided when the elements $\alpha^0, \alpha^1, \ldots$ are substituted for the first, the third and the fourth terms of the expression (3) in sequence. The constant term ($\sigma_0$) value is latched by the register 5 and thus is always output from this register 5.

Next, the adders $A_1$ to $A_4$ add the values output by the multiplier units $K_4$ to $K_1$ and the register 5, that is, the values of respective terms of the expression (3) output by a clock signal supplied by the computer control unit 1. Finally, the adder $A_4$ outputs the value provided by substituting the elements $\alpha^0, \alpha^1, \ldots$ for the error location polynomial $\alpha(x)$ to an output control unit 6.

This output control unit 6 supplies a data valid signal when the value of the error location polynomial to be entered is "0" and also supplies a select signal to the selector 7. Furthermore, it outputs a strobe signal to a register 13 of a final error location generating circuit unit 10 mentioned below.

On the other hand, the fifth multiplier unit $K_5$ has the arrangement which is similar to that of the upper first to fourth multiplier units $K_1$ to $K_4$. This multiplier unit $K_5$, on receiving the clock signal output by the computer control unit 1, sequentially generates $\alpha^0, \alpha^1, \ldots$ indicating the locations of received words in the received word train as synchronized with the substituting operation for the error location polynomial σ(x). It means that "α⁰=1" latched by the register 3₅ is output through the selector 2₅ and the values "α¹,α²,..." provided by the multiplier 4₅ are output in sequence.

The values indicating the locations of the received words, which are output from this fifth multiplier unit K₅, are applied to the selector 7. This selector 7 supplies the values indicating the locations of the received words, that is, error locations V when it receives the select signal applied by the output control unit 6.

Furthermore, the values indicating the locations of the received words, output by the fifth multiplier unit K₅, are supplied to the final error location generating circuit unit 10 in which these values are applied to the register 13 through the adder 11 and the selector 12.

This register 13 latches as an initial value the coefficient "σ₃" of the second term in the error location polynomial to be entered into the multiplier unit K₃. This latched "σ₃" is applied to one of input terminals of the adder 11.

The register 13 performs latching operation by virtue of the strobe signal output by the output control unit 6 when an error location is detected. Namely, every time an error location is detected, the value indicating the location is latched in sequence as follows:

$$\sigma_3 + V_1$$
$$\sigma_3 + V_1 + V_2$$
$$\cdot$$
$$\cdot$$
$$\cdot$$

when the third error location is detected, $$\sigma_3 + V_1 + V_2 + V_3$$

is latched and then is output as the fourth error location through the selector 7.

Under the process mentioned above, the error pattern is obtained on the computed error locations so as to correct the erroneous received words.

The embodiment mentioned above describes the present invention applied to a Reed Solomon code for 4-word correction on the Galois field GF(2⁸). Yet, this invention is not limited by the size of the Galois field or the number of errors to be corrected. Moreover, the similar processing can be done for a correcting code except the Reed Solomon code for obtaining an error location on the Chien Algorithm.

A description will be directed to the another embodiment of the error correcting device of this invention.

The operation processing described above can be executed for a unit consisting of each column in a matrix. The embodiment of this invention provides a device for rapid processing with each column as a unit by means of hardware arrangement.

The above-mentioned matrix consisting of 4 rows and 5 columns can be expressed as a general expression of the (61) expression shown below:

$$\begin{vmatrix} a_{1,1}a_{1,2}a_{1,3}a_{1,4}a_{1,5} \\ a_{2,1}a_{2,2}a_{2,3}a_{2,4}a_{2,5} \\ a_{3,1}a_{3,2}a_{3,3}a_{3,4}a_{3,5} \\ a_{4,1}a_{4,2}a_{4,3}a_{4,4}a_{4,5} \end{vmatrix} \tag{61}$$

In this matrix, if the element $a_{1,1}$ in the first column is transformed to "1" and the elements $a_{2,1}$, $a_{3,1}$ and $a_{4,1}$ therein are also transformed to "0", after the transformation, the values of respective elements $a_{1,2}'$, $a_{2,2}'$, $a_{3,2}'$ and $a_{4,2}'$ can be obtained by the following method:

$$a_{1,2}' = a_{1,2} \div a_{1,1}$$

$$a_{2,2}' = a_{1,2} \div a_{1,1} \times a_{2,1} + a_{2,2}$$

$$a_{3,2}' = a_{1,2} \div a_{1,1} \times a_{3,1} + a_{3,2}$$

$$a_{4,2}' = a_{1,2} \div a_{1,1} \times a_{4,1} + a_{4,2} \tag{62}$$

Figure 11:
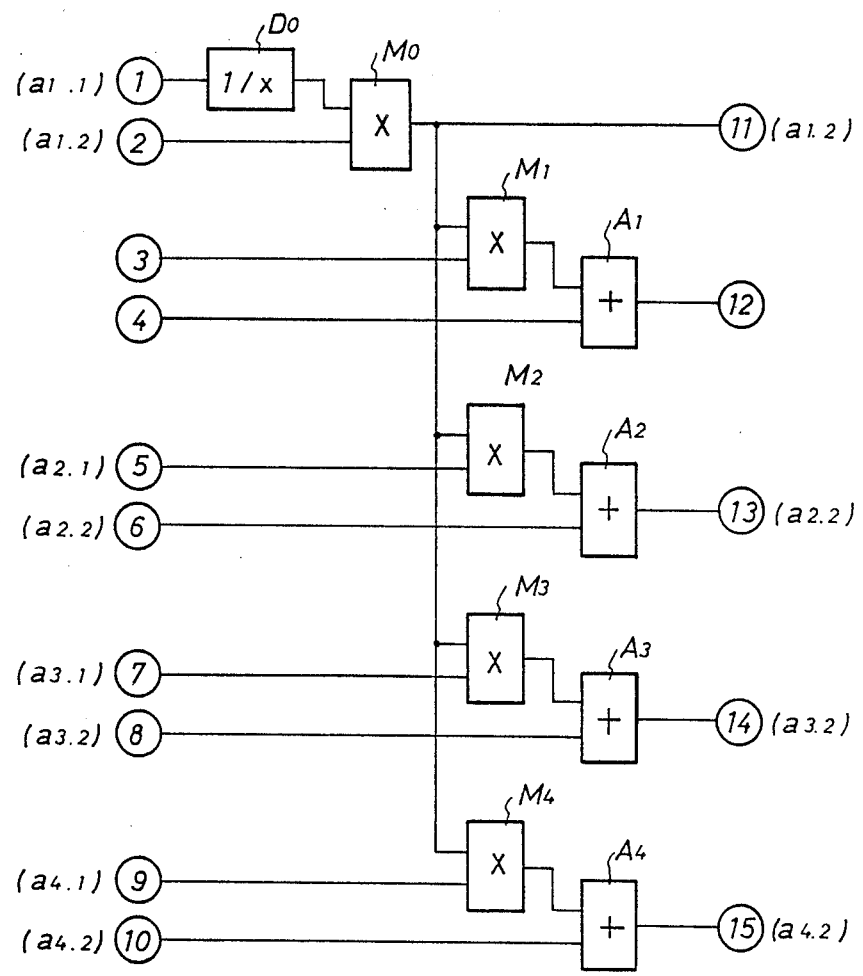
FIG. 11 is a diagram showing the principle of an error correcting device of the present invention.

FIG. 11 shows a principle of an operation circuit of the present invention for executing the operation shown in the above-mentioned (62) expression. Thus, the operations in the third to the fifth columns can be processed like the above.

Furthermore, the first column is processed to be;

$$\begin{vmatrix} 1 \\ 0 \\ 0 \\ 0 \end{vmatrix}$$

As is obvious from the (6) expression shown above, in order to obtain an coefficient of an error location polynomial, the values in the first to the fourth columns must be processed to have a unit matrix format. Thus, these values are irrelevant to those saved in respective registers of the first to the fourth columns. Moreover, more efficient processing can be achieved using the previous values as will be described below. So, the values in the processed column including the first column do not need the rewriting process to the values mentioned above, for example, so that a concrete description will be directed to the processing of the second column.

The computing circuit is comprised of a multiplier M₀ connected to a reciprocal generator D₀ for generating a reciprocal of an input data word on one of the input terminals, multipliers M₁ to M₄ connected to the output terminal of the multiplier M₀ on each one of their input terminals and adders A₁ to A₄ connected to the output terminals of these multipliers M₁ to M₄ on each one of their input terminals. The outer input terminals of these multiplier M₀ and M₁ to M₄ and adders A₁ to A₄ receives the data words as described below.

In FIG. 11, ① denotes an input terminal of the reciprocal generator D₀. ②, ③, ⑤, ⑦ and ⑨ respectively denote the other terminals of the multipliers M₀ to M₄. ④, ⑥, ⑧ and ⑩ respectively denote the other terminals of the adders A₁ to A₄. ⑪ denotes the output terminal of the multiplier M₀. ⑫ to ⑮ respectively denote the output terminals of the adders A₁ to A₄. In addition, for the convenience's sake, the marks indicating each element of the matrix shown above are identical to those indicating each register for saving an element.

With regard to the second column described above, the (62) expression must be transformed to give the first column the following values:

$$\begin{vmatrix} 1 \\ 0 \\ 0 \\ 0 \end{vmatrix}$$

For realizing that, the following element data is required to be input to respective input terminals:

```
1  ... a_{1,1}
2  ... a_{1,2}
5  ... a_{2,1}
6  ... a_{2,2}
7  ... a_{3,1}
8  ... a_{3,2}
9  ... a_{4,1}
10 ... a_{4,2}
```

As a result, the transformed data is output at each output terminals as follows:

```
11 ... a_{1,2}'
13 ... a_{2,2}'
14 ... a_{3,2}'
15 ... a_{4,2}'
```

Namely, $a_{1,2}/a_{1,1}$ is obtained by generating a reciprocal $1/a_{1,1}$ of the element $a_{1,1}$ input from the terminal 1 in the reciprocal generator $D_0$ and then multiplying the reciprocal by a value $a_{1,2}$ of the element $a_{1,2}$ input from the input terminal 1 in the multiplier $M_0$. This is equal to the value of the element $a_{1,2}$ in the row containing the element $a_{1,1}$ to be given 1, that is, the first element of the (62) expression. Further, it is the resulting value of the operation $a_{1,2} \div a_{1,1}$ in the right side with regard to the elements $a_{2,2}$, $a_{3,2}$ and $a_{4,2}$ of the (62) expression.

The multipliers $M_2$ to $M_4$ provides the resulting values obtained by multiplying each element value in the first column of each row containing the elements $a_{2,2}$, $a_{3,2}$ and $a_{4,2}$ in the second to the fourth columns, that is, the element values $a_{2,1}$, $a_{3,1}$ and $a_{4,1}$ to be given "0" by the value of $a_{1,2}/a_{1,1}$. Then, the adders $A_2$ to $A_4$ respectively add the resulting values to the original values $a_{2,2}$, $a_{3,2}$ and $a_{4,2}$. As a result, the transformation by the (62) expression is completed.

Figure 12I:
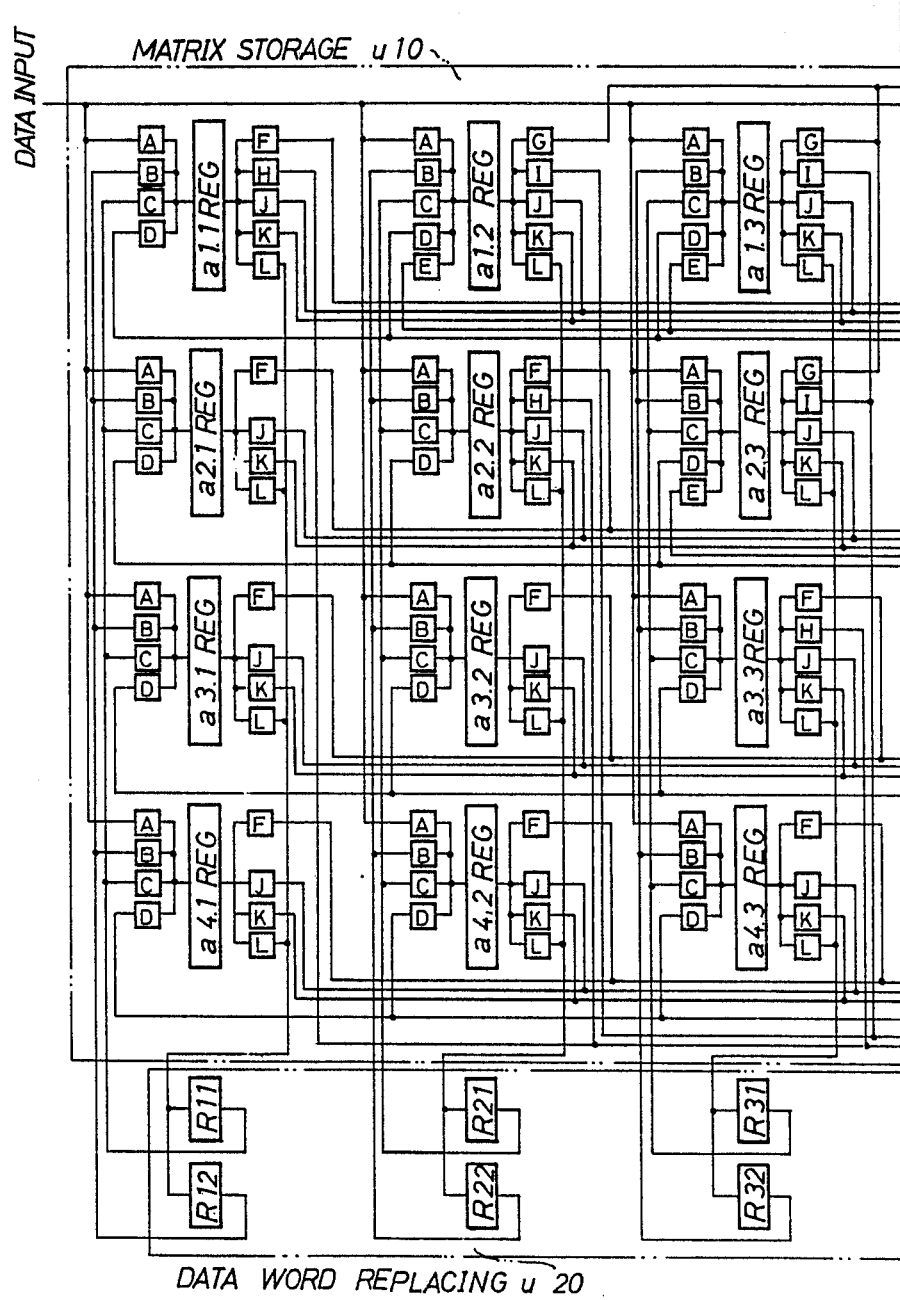
FIGS. 12i-12ii shows the embodiment of the error correcting and decoding device of the present invention.
Figure 12:
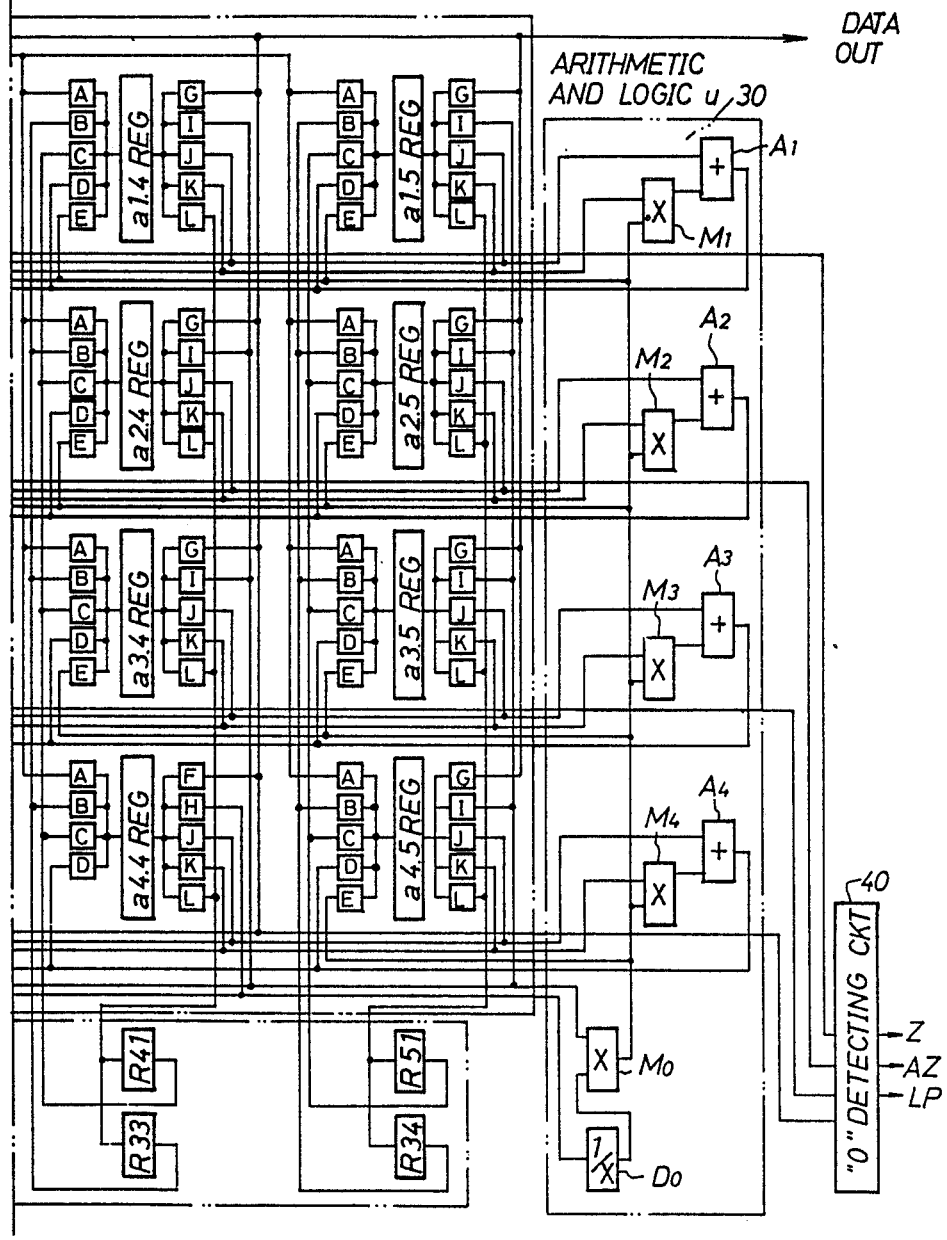

FIG. 12 shows an embodiment of the error correcting device of the present invention which is made by modifying the computing device shown in FIG. 11 to apply to the processing of a matrix consisting of 4 rows and 5 columns. This device is comprised of a matrix storage unit 10 consisting of registers arranged in 4 rows and 5 columns for saving data words for respective elements, a data word replacing unit 20 consisting of buffer registers $R_1$, $R_2$, each two provided in one column, an arithmetic and logic unit 30 as shown in FIG. 11 and a "0" detecting unit 40.

The matrix storage unit 10 consists of registers for saving respective elements of the following matrix as has been shown before in the (61) expression:

$$\begin{vmatrix} a_{1,1} a_{1,2} a_{1,3} a_{1,4} a_{1,5} \\ a_{2,1} a_{2,2} a_{2,3} a_{2,4} a_{2,5} \\ a_{3,1} a_{3,2} a_{3,3} a_{3,4} a_{3,5} \\ a_{4,1} a_{4,2} a_{4,3} a_{4,4} a_{4,5} \end{vmatrix}$$

These registers are respectively named as $a_{1,1}$ to $a_{4,5}$, which correspond with the positions of the elements $a_{1,1}$ to $a_{4,5}$ saved therein.

The marks A to H enclosed in □ in this matrix storage 10 mean gates. All the gates with the same mark perform the same function. The gate A is an input side gate for saving a data word. The gate G is an output gate for outputting the processed data word. The functions of the other gates are described below.

The data word replacing unit 20 provides each two buffer registers in each column, for example, the buffer registers $R_{11}$, $R_{12}$ in the first column. They store the data words from the gate L of the registers for their territory and return the data words stored in them to the registers in their territorial column through the gate B or C.

The arithmetic and logic unit 30 includes the similar arrangement and function to that shown in FIG. 11. The computing elements corresponding with that in FIG. 11 are shown by the same mark. These computing elements execute the operation shown in FIG. 11 with regard to the data words sent from the gates H, I, J, K of respective registers of the matrix storage unit 10 and supply the results to respective registers through the gate D or E.

The 0-detecting circuit 40 is a circuit which distinguishes whether or not the data words from the gates F provided in the first to the fourth columns are "0".

The operation of the embodiment of the error correcting device for a long distance code of the present invention in FIG. 12 will be described with referennce to the case where the subject device is used for correcting an error in a matrix consisting of eight syndromes $S_0$ to $S_7$.

The flowchart consisting of the steps [101] to [113] steps shown in FIG. 13 describes the process of substituting the syndromes $S_0$ to $S_7$ for respective registers in the matrix storage unit 10 as shown in the first term in the left side of the (5) expression, that is, the (63) expression described below.

$$\begin{bmatrix} S_0 S_1 S_2 S_3 S_4 \\ S_1 S_2 S_3 S_4 S_5 \\ S_2 S_3 S_4 S_5 S_6 \\ S_3 S_4 S_5 S_6 S_7 \end{bmatrix} \quad (63)$$

The step [Φ] brings the gate A into the conducting state so as to allow the register selected by a latch signal to save a syndrome input from an input line 11. The step [102] sets an initial value of i to 1 and then the step [103] outputs a syndrome $S_{(i-1)}$, that is, $S_0$ on an input line 11.

Next, the step [104] sets a column number j to a value which is identical to the i (in this case, 1) and the step [105] makes sure that j is equal or less than the range of rows t, in other words, number of errors to be corrected as is obvious from the (6) expression. Then, the step [107] obtains a subscript indicating a column number and supplies a latch signal to the $a_{j,k}$ register (in this case, $a_{1,1}$), so that the syndrome $S_0$ is saved in the register $a_{1,1}$ in the step [108].

In the next step [109], as is obvious from the (63) expression, the values of the elements $a_{1,2}$ and $a_{2,1}$ both have the same syndrome $S_1$ and the values of the elements $a_{1,3}$, $a_{2,2}$ and $a_{3,1}$ have the same syndrome $S_2$. Later, from the syndromes $S_3$ to $S_7$, the same data word is substituted for the elements on a oblique line. Thus, if −1 added to the subscript j indicating the row number and +1 is also added to the subscript k indicating the column number, the register in the upper right hand of the just-written one is specified as the next object to be written. Yet, there is no register in the upper right hand of the $a_{1,1}$ register. If there is no actual register to be specified by the step [109], the step [110] checks the column number and the step [111] also checks the row number so as to exclude this specification by the step [109]. The next step [112] adds +1 to i and then returns to the step [103].

The step [103] supplies the syndrome $S_1$ on the input line because of i=2. Then, the step [104] sets the row number j to the value of i, that is, 2 and the step [105] makes sure that j is less than the row value and then the column number k is set as i−j+1=2+1=1. The step [108] writes the syndrome $S_1$ to the register $a_{2,1}$ specified by these row and column numbers.

The next step [109] specifies the register $a_{1,2}$ by subtracting 1 from the row number j and adding 1 to the column number k. According to these values of j and k, the program goes from the step [110] to the step [111] and then returns to the [108] in which the syndrome $S_1$ is also written in this register $a_{1,2}$.

The process described above is repeated until i becomes twice as large as the number of syndromes, that is, the number t in the range of the row as shown in the step [113]. By this process, the syndromes are written in respective registers $a_{1,1}$ to $a_{4,5}$ as shown in the (63) expression.

In the description stated below, the syndromes $S_0$ to $S_7$ are given concrete numerical values of 0, 15, 85, 115, 193, 115, 161 and 231 like the (8) expression, for better understanding of the description. The matrix given these numerical values is as follows:

$$\begin{vmatrix} 0 & 15 & 85 & 115 & 193 \\ 15 & 85 & 115 & 193 & 115 \\ 85 & 115 & 193 & 115 & 161 \\ 115 & 193 & 115 & 161 & 231 \end{vmatrix} \quad (64)$$

In order to obtain the coefficients $\sigma_0$ to $\sigma_3$ in an error position polynomial by performing left side fundamental transformation over this matrix, it is necessary to transform this (64) matrix into the (65) matrix shown below by means of the (6) and the (7) expressions as mentioned above.

$$\begin{vmatrix} 1 & 0 & 0 & 0 & \sigma_0 \\ 0 & 1 & 0 & 0 & \sigma_1 \\ 0 & 0 & 1 & 0 & \sigma_2 \\ 0 & 0 & 0 & 1 & \sigma_3 \end{vmatrix} \quad (65)$$

Figure 14:
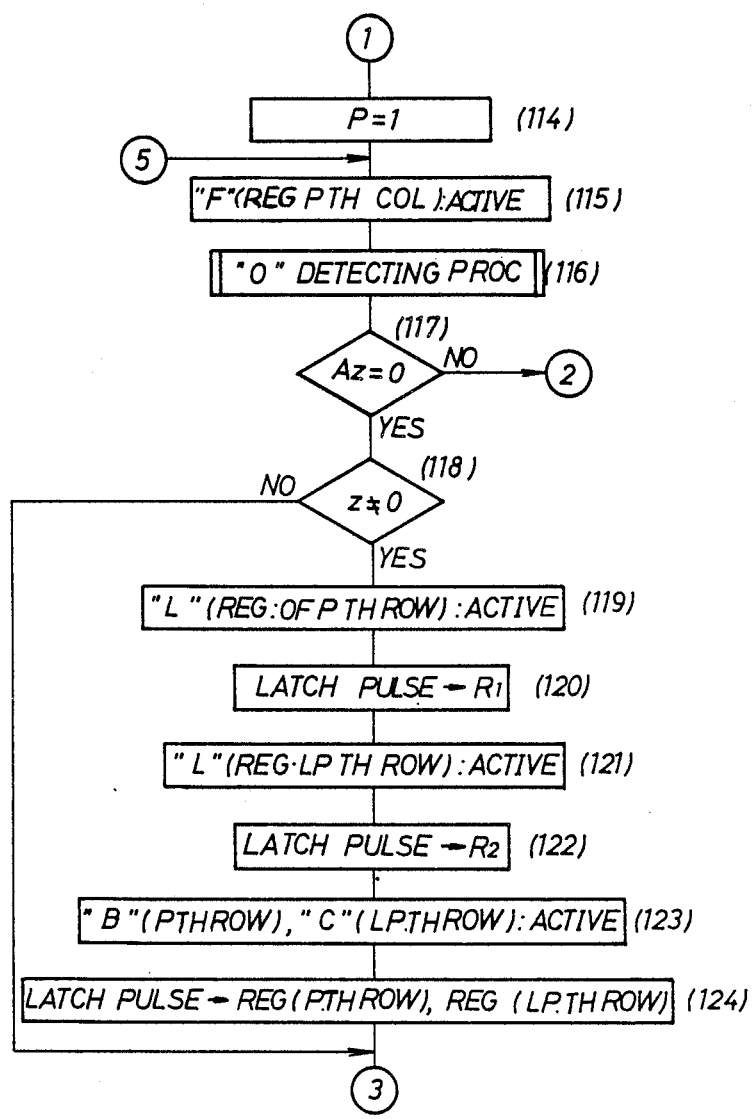

The flow shown in FIG. 14 means a routine which replaces the element value "0" with another element value except "0" within the same column when the element value to have the data word value of "1" is actually "0". Concretely, with regard to the above-mentioned (64) expression, it is a routine which replaces the first row with the second row containing a data word value except "0" because the data word value of $a_{1,1}$ in the first column of the first row is "0".

The step [114] sets "1" as an initial value of a row number P to be processed. Then the step [115] causes the output gate F in the first column to be in the conducting state and checks the values of the elements $a_{1,1}$, $a_{2,1}$, $a_{3,1}$ and $a_{4,1}$ so as to output the data words from the registers $a_{1,1}$ to $a_{4,1}$ to the "0" detecting circuit 40.

In the step [116], the 0-detecting circuit 40 executes the "0" detecting process in FIG. 14 so as to check whether all elements contained in the first column are "0" or not and whether the element to have a value of "1" is "0" or not.

Figure 17:
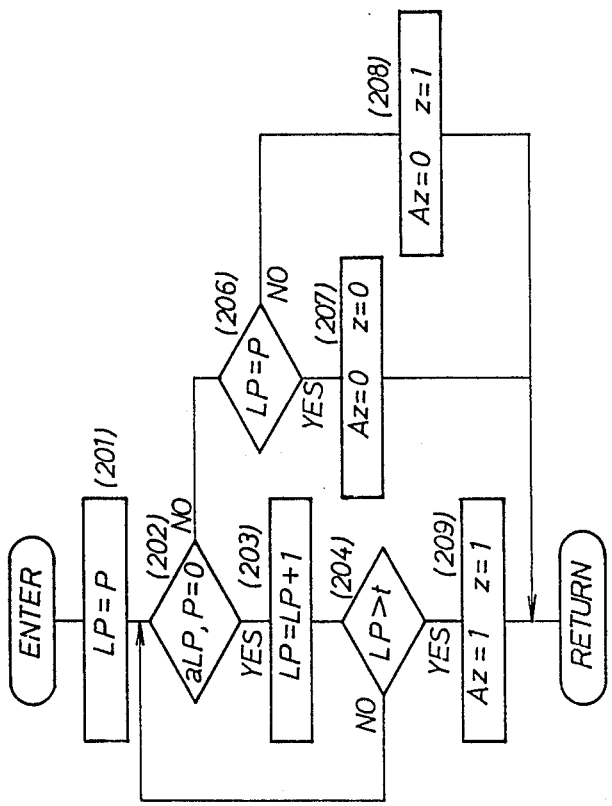

FIG. 17 is a flow chart for processing "0" detection. The step [201], at first, specifies the element $a_{1,1}$ to have a value of "1" by making the row number LP identical to the column number P. The step [202] checks whether the element value is "0" or not.

In this embodiment, the element value is "0", so that the step [203] adds 1 to the row number LP to specify the element $a_{2,1}$ in the next row. Then, the step [204] makes sure that this row is allowed to exist in the matrix. If so, the program returns to the step [202] which checks whether this element value is "0" or not. In this case, since this element $a_{2,1}$ has a value of 15, the routine goes to the step [206].

If the step [204] judges that the row is not allowed to exist in the matrix, it means that there is no element having any value except "0" in this column. So, a flag Az is set to "1" and a flag z is also set to "1". The former indicates that all the elements in the checked row are "0" and the latter indicates that the element to have a value of "1" is "0".

As mentioned above, in this case, $a_{2,1}$ is an element having a value except "0" and the relation between L and P is LP=2, P=1 and LP≠L. Thus, the routine goes from the step [206] to [208], in which the flag Az is set to "0" to indicate that the element of the checked row has a value except "0" and the flag z is set to "1" to indicate that the element $a_{1,1}$ to have a value of "1" is "0".

If the element to have a value of "1", that is, $a_{p,p}$ having the same column number P and row number LP does not have a value of "0", the routine goes from the steps [202] and [206] to the step [207], in which the flags Az and z are both set to "0" to indicate the element to have a value of "1" does not have a value of "0".

After those flags Az and z are set, the program returns to the routine shown in FIG. 14, in which the step [117] checks the flag Az. In this case, the element $a_{1,1}$ is "0" and the element $a_{2,1}$ is not "0". Thus, the flag Az is set to "0" and the flag z is set to "1", as mentioned above. Then, the routine goes from the steps [117] and [118] to the steps [119] to [124] in which a column in the matrix are replaced with another one, concretely, the first column is replaced with the second column.

Moreover, if the element values in the column being processed are all "0" and the flag Az is set to "1" in the step [116], the step [117] judges that no error exists or will be found in the process in the later steps. This routine finishes the process and goes to the step [132] or later shown in FIG. 16 which reads out coefficients of an error location polynomial. Furthermore, it the flag z is 1 in the step [118], it is not necessary to replace the rows with each other, so that the program exits from this routine at ③ and goes to the step [125] shown in FIG. 15 as described later.

Of the steps [119] to [124] for replacing the rows, the step [119] reads out the data words from all the registers in the Pth row saving the data words of the elements to be replaced, in this case, the first row. The step [120] supplys a latch pulse to $R_1$ and temporarily saves these data words in one buffer register $R_1$ belonging to that row and then the step [121] reads out the data words from all the registers in the LPth row saving these data words of the elements to be replaced. The step [122] supplys a latch pulse to $R_2$ and temporarily saves these data words in the other buffer register $R_2$. Next, the step [123] causes the data B in the Pth row and the gate C in the LPth row to be conducted and then the step [124] supplies a latch signal to all the registers belonging to the first and the second (Pth and LPth) rows so as to make these registers store the data word in the replaced rows. This is the finish of the replacement or rows.

This replacement results in the following (66) expression formed by replacing the first row in the (64) expression with the second therein:

$$\begin{vmatrix} 15 & 85 & 115 & 193 & 115 \\ 0 & 15 & 85 & 115 & 193 \\ 85 & 115 & 193 & 115 & 161 \\ 115 & 193 & 115 & 161 & 231 \end{vmatrix} \quad (66)$$

Figure 15:
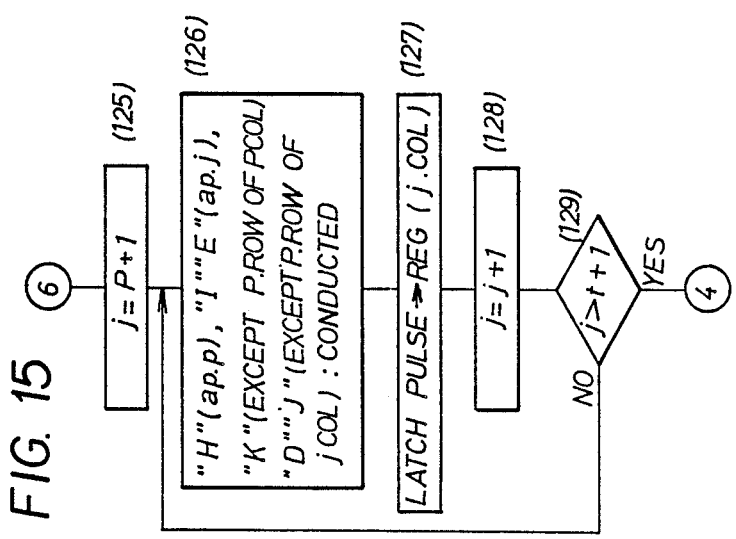

The steps [125] to [129] in FIG. 15 consists of a routine which sequentially transforms the rows so as to bring the values in the first to the fourth rows to the following:

$$\begin{vmatrix} 1 \\ 0 \\ 0 \\ 0 \end{vmatrix}, \begin{vmatrix} 0 \\ 1 \\ 0 \\ 0 \end{vmatrix}, \begin{vmatrix} 0 \\ 0 \\ 1 \\ 0 \end{vmatrix}, \begin{vmatrix} 0 \\ 0 \\ 0 \\ 1 \end{vmatrix}$$

With regard to the process of the first column being described, the step [125] sets the column number $i=P+1=2$ as an initial value of the column to be processed. Now, a concrete description will be directed to an operation for obtaining respective elements in the second to the fifth rows when the first column in the above-mentioned matrix is transformed to;

$$\begin{vmatrix} 1 \\ 0 \\ 0 \\ 0 \end{vmatrix}$$

The step [126] causes the gate H for the register corresponding with the element $a_{1,1}$ in the first column to have a value of "1", the gate 1 for the register corresponding with the element $a_{1,1}$, the gate K for the registers corresponding with the elements $a_{2,1}$, $a_{3,1}$ and $a_{4,1}$ and the gate J for the registers corresponding with the elements $a_{2,2}$, $a_{3,2}$ and $a_{4,2}$ to be conducted. Then this step supplies the values from these registers to an arithmetic and logic unit 30 in FIG. 12 corresponding with the computing circuit shown in FIG. 11 and also supplies the resulting values to those registers by causing an input side gate E for the register $a_{1,2}$ and an input side gate D for the resisters $a_{2,2}$, $a_{3,2}$ and $a_{4,2}$ to be conducted. Next, the Step [127] makes these registers save the resulting values by supplying a latch pulse to each register in j column.

Under the process of setting a value of the element $a_{1,1}$ in the first column of the first row to "1" and values of the elements $a_{2,1}$, $a_{3,1}$ and $a_{4,1}$ to "0", if the process in the second column finishes, that is, the step [127] finishes, the values saved in respective registers of the matrix storage unit 10 are shown below (67):

$$\begin{vmatrix} 15 & 15 & 115 & 193 & 115 \\ 0 & 15 & 85 & 115 & 193 \\ 85 & 87 & 193 & 115 & 161 \\ 115 & 58 & 115 & 161 & 231 \end{vmatrix} \quad (67)$$

It is to be noted that the syndromes saved in the registers $a_{1,1}$ to $a_{4,1}$ respectively corresponding with the elements $a_{1,1}$ to $a_{4,1}$ in the first column do not have the values modified as follows:

$$\begin{vmatrix} 1 \\ 0 \\ 0 \\ 0 \end{vmatrix}$$

but they have the previous values.

In these values, the values in the second column have the values in the first column transformed to the above-mentioned values. For obtaining coefficients of an error location polynomial, what is required is just the values in the fifth column provided when the first to the fourth columns are transformed into a unit matrix and thus the values stored in the registers in the processed column are not used for obtaining coefficients of an error location polynomial, so that these values are not required to be modified. The embodiment of the present invention employs the values stored in these registers for efficient operation.

The next step [128] specifies the third column by adding 1 to the column number j for setting j=3 and the step [129] makes sure that this column is allowed to exist. Then, the program returns to the step [126] for processing the third column. The loop consisting of the steps [126] to [129] processes the second to the fifth columns by repeating this process four times, that is, the column number j=2 to j=5.

After the value of element $a_{1,1}$ is set to "1" and the values of the elements $a_{2,1}$, $a_{3,1}$ and $a_{4,1}$ are set to "0", the program exits from this step [129] to ④. At this time, the values saved in each register of the matrix storage unit 10 are as follows (68):

$$\begin{vmatrix} 15 & 15 & 107 & 36 & 107 \\ 0 & 15 & 85 & 115 & 193 \\ 85 & 87 & 58 & 72 & 90 \\ 115 & 58 & 14 & 182 & 154 \end{vmatrix} \quad (68)$$

Figure 16:
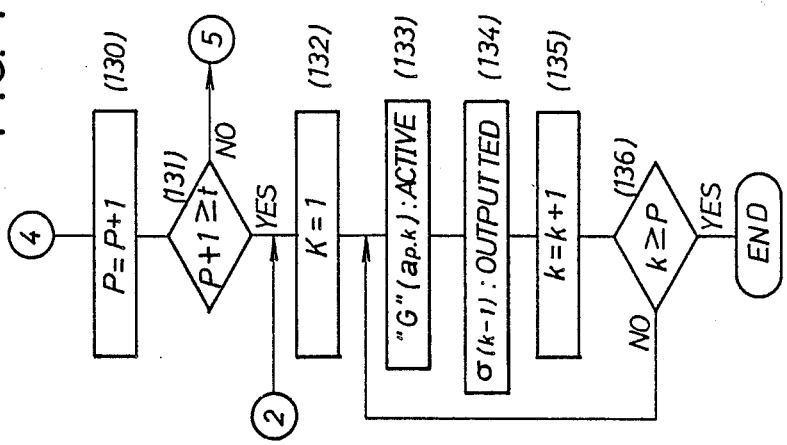

Next, turning to the flowchart shown in FIG. 16, in the process from ④ to the step [130], the number P of the column to be processed is made 2 by adding 1 thereto for changing the column to be processed from the first to the second column and this second column is transformed to;

$$\begin{vmatrix} 0 \\ 1 \\ 0 \\ 0 \end{vmatrix}$$

The step [131] makes sure that the column specified as the above has the column number which is equal or less than the error-correctable number which is equal or less than the error-correctable number t, that is, less than 5. Yet, in this case, the column to be processed is the second one, so that the program goes from ⑤ to the step [115] shown in FIG. 14.

Since the process from the steps [115] to [129] is similar to that described before, the detailed description thereof is skipped. The following (69) expression shows the matrix obtained as a result of the step [129] wherein the element in the second column of the second row is set to "1", those elements of the first, the third and the fourth row are set to "0":

$$\begin{vmatrix} 15 & 15 & 62 & 87 & 170 \\ 0 & 15 & 15 & 107 & 36 \\ 85 & 87 & 0 & 101 & 41 \\ 115 & 58 & 101 & 0 & 97 \end{vmatrix} \quad (69)$$

In the step [130] following this step [129], the third column is transformed to;

$$\begin{vmatrix} 0 \\ 0 \\ 1 \\ 0 \end{vmatrix}$$

like the above. The following (70) expression shows the resulting values of the elements.

$$\begin{vmatrix} 15 & 15 & 62 & 87 & 122 \\ 0 & 15 & 15 & 107 & 11 \\ 115 & 58 & 101 & 0 & 54 \\ 85 & 87 & 0 & 101 & 41 \end{vmatrix} \quad (70)$$

Likewise, the fourth column is transformed to;

$$\begin{vmatrix} 0 \\ 0 \\ 0 \\ 1 \end{vmatrix}$$

The following (71) expression shows the resulting values of the elements:

$$\begin{vmatrix} 15 & 15 & 62 & 87 & 64 \\ 0 & 15 & 15 & 107 & 120 \\ 115 & 58 & 101 & 0 & 54 \\ 85 & 87 & 0 & 101 & 15 \end{vmatrix} \quad (71)$$

As shown in this matrix, the coefficients $\sigma_0$, $\sigma_1$, $\sigma_2$ and $\sigma_3$ of an error location polynomial are proved to respectively have values of 64, 120, 54 and 15.

Moreover, in the (69) to (71) expressions, as mentioned when the first column is transformed to;

$$\begin{vmatrix} 1 \\ 0 \\ 0 \\ 0 \end{vmatrix}$$

the actual resulting values are as follows:

$$\begin{vmatrix} 1 & 0 & 0 & 0 & 64 \\ 0 & 1 & 0 & 0 & 120 \\ 0 & 0 & 1 & 0 & 54 \\ 0 & 0 & 0 & 1 & 15 \end{vmatrix} \quad (73)$$

though the numerical values in respective registers have not been rewritten.

Next, a description will be directed to the second operation of the embodiment of the present invention which can execute very rapid processing if a fewer errors are caused.

Assuming that the syndromes $S_0$ to $S_7$ are respectively set to 1, 2, 4, 8, 16, 32, 64 and 128 as a result of an error for one word, the (73) expression shown below corresponding to the (63) is changed to the following (74):

$$\begin{vmatrix} S_0 & S_1 & S_2 & S_3 & S_4 \\ S_1 & S_2 & S_3 & S_4 & S_5 \\ S_2 & S_3 & S_4 & S_5 & S_6 \\ S_3 & S_4 & S_5 & S_6 & S_7 \end{vmatrix} \quad (73)$$

$$\begin{vmatrix} 1 & 2 & 4 & 8 & 16 \\ 2 & 4 & 8 & 16 & 32 \\ 4 & 8 & 16 & 32 & 64 \\ 8 & 16 & 32 & 64 & 128 \end{vmatrix} \quad (74)$$

The operation example described above transforms this (74) expression into the following (75) expression by means of the procedure mentioned above and then obtains the error number, 1, on the basis of the resulting matrix:

$$\begin{vmatrix} 1 & 2 & 4 & 8 & 16 \\ 2 & 0 & 0 & 0 & 0 \\ 4 & 0 & 0 & 0 & 0 \\ 8 & 0 & 0 & 0 & 0 \end{vmatrix} \quad (75)$$

The number of errors is determined on the ground that the second, the third and the fourth rows of the second column are all "0", so that the values in the third to the fifth columns are not required for seeking the number of errors.

Accordingly, at the time of finishing the transformation of the second column, if the values in the second to the fourth rows of the second column are decided to be "0", the operation is not required further, so that the operation may stop so as to reduce the operation times.

Figure 18:
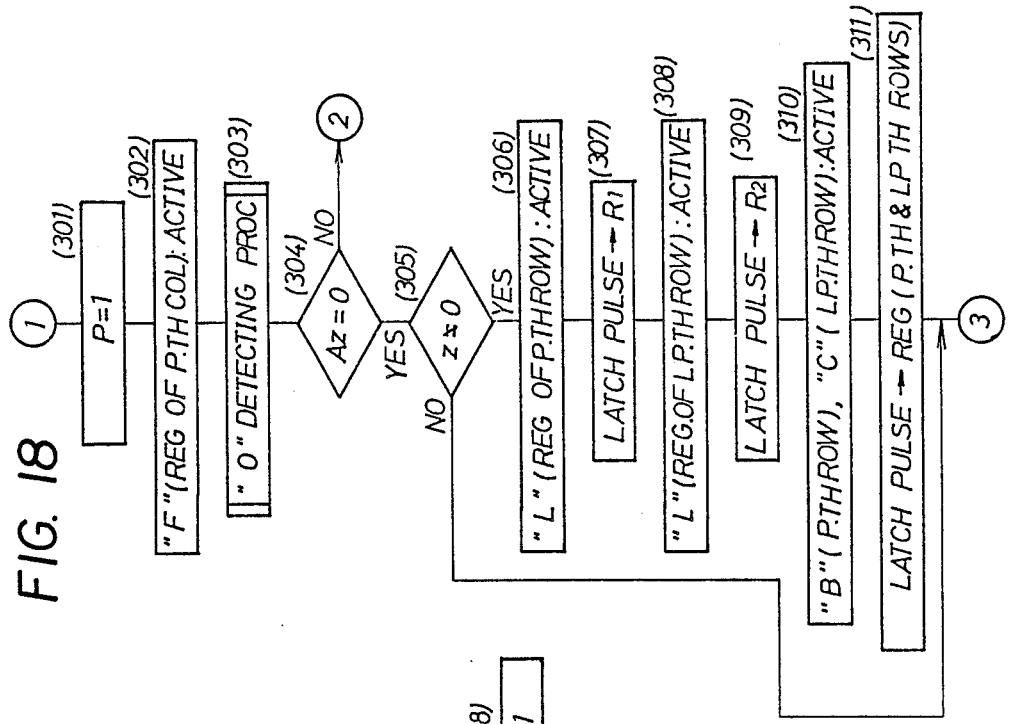
Figure 20:
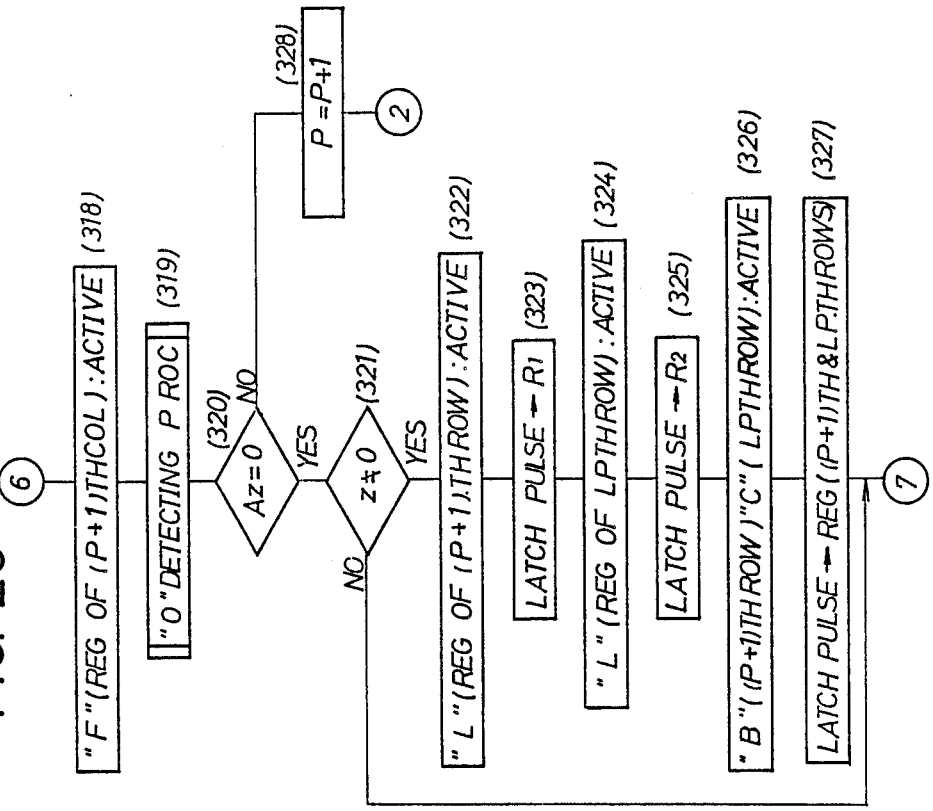
Figure 19:
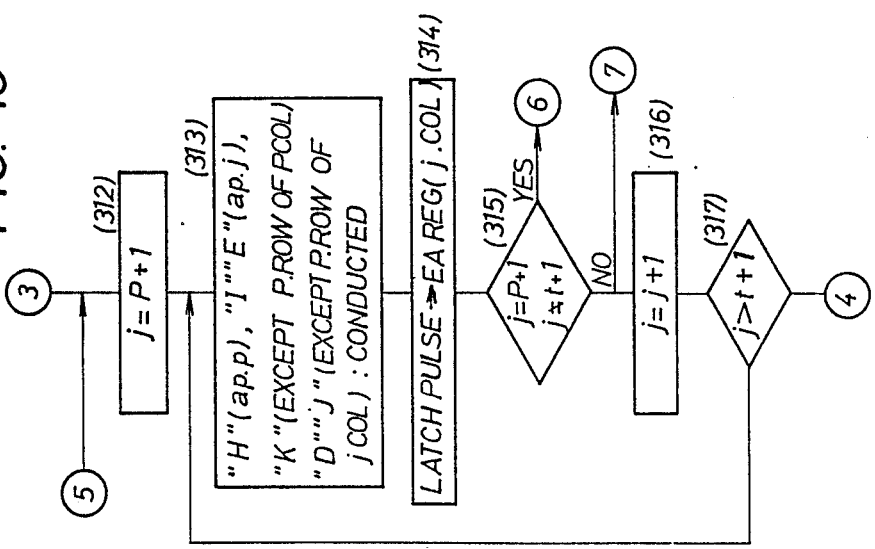

FIGS. 18 to 20 are flowcharts for the operation example for executing the process mentioned above. They correspond with the flowcharts shown in FIGS. 14 and 15. Saving syndromes shown in FIG. 13 and the modification of columns to be processed and the readout of coefficients of an error location polynomial are identical to those of the first operation example mentioned above. So, all the flowcharts of this operation example are shown in FIGS. 13, 18, 19, 20, 16 and 17, the last of which shows the process for detecting "0".

Figure 13:
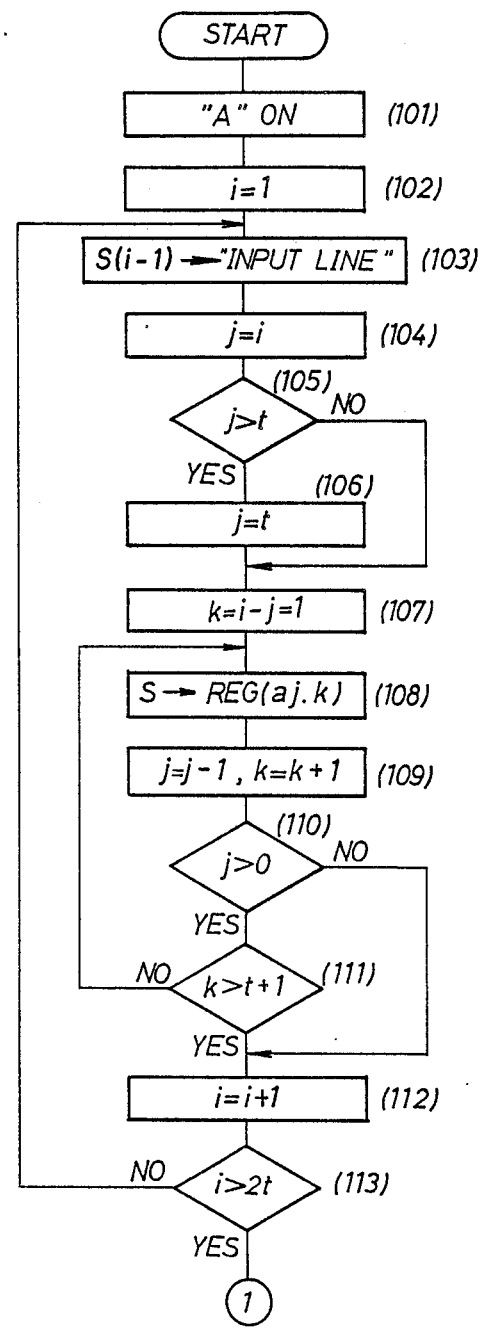
FIGS. 13 to 21 are flowcharts showing the processing operations.

The elements in the matrix are saved in the corresponding registers in accordance with the flowchart shown in FIG. 13, but the description of this process is left out because it has been already described above.

FIG. 18 is a flowchart for replacing the rows with each other. It is identical to the flowchart shown in FIG. 14 for describing the operation example mentioned above. The steps [301] to [311] shown in FIG. 18 respectively correspond with the steps [114] to [124] shown in FIG. 14. The difference between FIG. 14 and FIG. 18 is only the routine returning to the step [115] at 5 as shown in FIG. 14. Thus, the detailed description about FIG. 18 is left out.

In addition, the routine at 5 returns to the step [312] shown in FIG. 19.

The steps [312] to [314] shown in FIG. 19 respectively correspond with the steps [125] to [127] in FIG. 15. As described before, the first column is transformed to;

$$\begin{vmatrix} 1 \\ 0 \\ 0 \\ 0 \end{vmatrix}$$

since it is a basic column P. At this time, if the number of errors is 1, the second to the fourth rows of the second column are all "0". The step [315] judges whether or not the column number j of the column being processed is the next one of the basic column, that is, in this case, the second column and that the column is not one showing coefficients of an error location polynomial, that is, the fifth column. If these conditions are satisfied, the routine goes from ⑥ to the step [318] shown in FIG. 10 which judges whether the process is to be continued or not.

The process executed in the steps [319] to [320] is identical to that in the steps [116] to [117] shown in FIG. 14. Yet, the step [318] modifies the column to be processed to be the second column next to the basic column P, that is, the first column.

The step [319] performs "0" detecting process in the step [201] shown in FIG. 17. The step [201] makes the row number LP identical to the column number P and checks the value of the element $a_{2,2}$. If it is "0", the step [203] specifies the element $a_{3,2}$ in the next row and judges if it actually exists. If it exists, the routine returns to the step [202]. It checks the value of the element $a_{3,2}$. The value of the element $a_{4,2}$ is also checked in the same process. If all these elements $a_{2,2}$, $a_{3,2}$ and $a_{4,2}$ have a value of "0", the flags Az and z are both set to "1".

If there is only a single error, when the step [320] next to this step [319] checks the flag Az, it is set to "1". Thus, the routine branches to the step [328] which specifies the second column by adding 1 to the column number P. Then the steps [132] to [136] shown in FIG. 16 read out the coefficients of the error location polynomial. This is the finish of the process.

If all the elements $a_{2,2}$, $a_{3,2}$ and $a_{4,2}$ do not have a value of "0", the steps [320] to [321] judge whether the element to have a value of "1" is "0" or not. If it is to be replaced with "1", the steps [322] to [327] replace the rows with each other. Then, the routine returns to the steps [316] shown in FIG. 19 at ⑦. In this step or later, the operation mentioned above is similarly executed.

In addition, the steps [322] to [327] are provided in place of the steps [119] to [124] shown in FIG. 14 because the steps returning from the step [131] shown in FIG. 16 through ⑤ are changed to the steps [312] shown in FIG. 19.

Next, a description will be directed to the third operation example of the embodiment of the present invention which can execute more rapid operation than the above-mentioned opertion example if few erros are caused.

Assuming that the syndromes $S_0$ to $S_7$ are respectively 3, 10, 36, 136, 42, 200, 199 and 166, the matrix formed by substituting these syndromes for the (74) expression is shown in the following (77) expression. In addition, these syndromes contain two errors.

$$\begin{vmatrix} 3 & 10 & 36 & 136 & 42 \\ 10 & 36 & 136 & 42 & 200 \\ 36 & 136 & 42 & 200 & 199 \\ 135 & 42 & 200 & 199 & 166 \end{vmatrix} \tag{77}$$

As has been described in the previous operation example, for transforming the first column of this matrix into;

$$\begin{vmatrix} 1 \\ 0 \\ 0 \\ 0 \end{vmatrix}$$

transorming only the second column results in the following (78) expression:

$$\begin{vmatrix} 3 & 6 & 36 & 136 & 42 \\ 10 & 24 & 136 & 42 & 200 \\ 36 & 80 & 42 & 200 & 199 \\ 136 & 61 & 200 & 199 & 166 \end{vmatrix} \tag{78}$$

This result shows the elements in the second to the fourth rows of the second column are value except "0", so that more than one error is proved to be caused. The processing of the third column following that of the second column results in transformation of the (78) to the (79) expression:

$$\begin{vmatrix} 3 & 6 & 28 & 136 & 42 \\ 10 & 24 & 80 & 42 & 200 \\ 36 & 80 & 253 & 200 & 199 \\ 136 & 61 & 142 & 199 & 166 \end{vmatrix} \tag{79}$$

When the transformation of the first to the third columns is completed, the second column can be transformed to;

$$\begin{vmatrix} 0 \\ 1 \\ 0 \\ 0 \end{vmatrix}$$

Thus, the transformation of the third column results in the following (80) expression:

$$\begin{vmatrix} 3 & 6 & 8 & 136 & 42 \\ 10 & 24 & 6 & 42 & 200 \\ 36 & 80 & 0 & 200 & 199 \\ 136 & 61 & 0 & 199 & 166 \end{vmatrix} \quad (80)$$

Since the values in the third and the fourth rows of the third column of the (80) expression are all "0", there is no error in the third and the fourth rows and the number of errors is proved to be 2.

Figure 21:
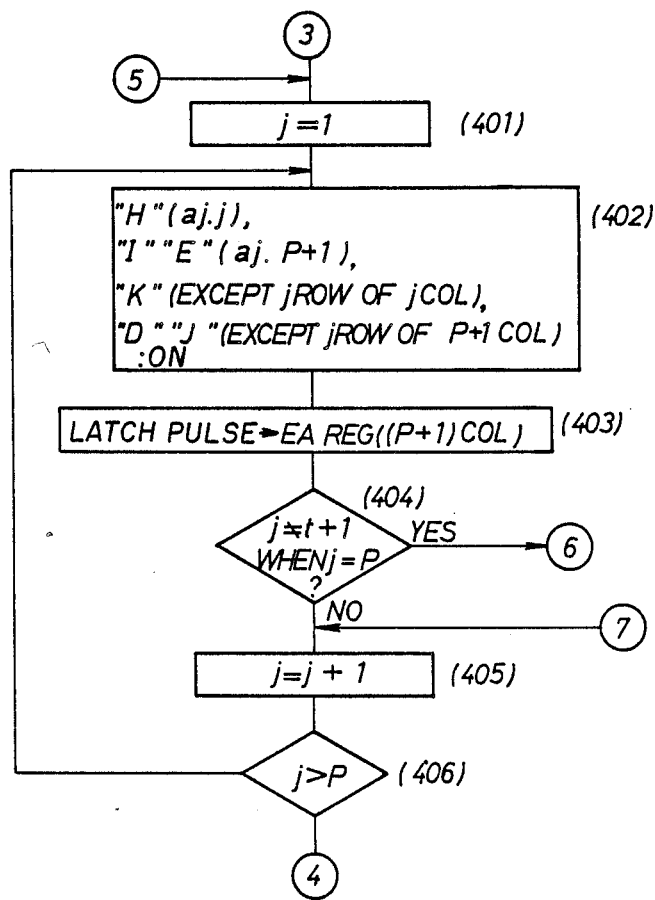

FIG. 21 is a flowchart corresponding to FIG. 19 relevant to the second operation example. All the flowcharts relevant to the third operation example are FIG. 13, FIG. 18, FIG. 21, FIG. 20, FIG. 16 and FIG. 17 showing "0" detecting process.

The step [312] in the flowchart shown in FIG. 19 corresponding with the second operating example specifies the processing of the column from next to that to be transformed into to last one (p+1 column);

$$\begin{vmatrix} 0 \\ 1 \\ 0 \\ 0 \end{vmatrix}$$

On the other hand, in FIG. 21, the third operation example shown in FIG. 13 has the different steps [401] and [406]. The former fixes (p+1) the column, as the column to be processed specifies the first column the basic j column transformed and transforms pth column, and the latter changes the condition $j > t+1$ for finishing a loop in the step [317] shown in FIG. 19 into $i > P$.

The matrix to be entered into this step [401] is shown in the (77) expression, but it is shown again as the following (81) expression:

$$\begin{vmatrix} 3 & 10 & 36 & 136 & 42 \\ 10 & 36 & 136 & 42 & 200 \\ 36 & 136 & 42 & 200 & 199 \\ 136 & 42 & 200 & 199 & 166 \end{vmatrix} \quad (81)$$

The step [402] transforms the values in the second column in order to give the first column the following values;

$$\begin{vmatrix} 1 \\ 0 \\ 0 \\ 0 \end{vmatrix}$$

The step [403] supplys a latch pulse to registers in P+1 column and results in the following (82) expression corresponding to the (78) expression:

$$\begin{vmatrix} 3 & 6 & 36 & 136 & 42 \\ 10 & 24 & 136 & 42 & 200 \\ 36 & 80 & 42 & 200 & 199 \\ 136 & 61 & 200 & 199 & 166 \end{vmatrix} \quad (82)$$

The step [404] checks whether the processing is to be finished or not and whether the replacement of rows is required or not by the "0" detecting process shown in FIG. 17 and then sets the flags Az and z.

In this case, since the values in the second to the fourth rows of the second column are any value except "0", the step [405] makes sure that the column to be processed exists by adding 1 to the column number and then returns to the step [402]. Next, for transforming the third column, the first column must be transformed to;

$$\begin{vmatrix} 1 \\ 0 \\ 0 \\ 0 \end{vmatrix}$$

and the second column must be transformed to;

$$\begin{vmatrix} 0 \\ 1 \\ 0 \\ 0 \end{vmatrix}$$

The transforming process mentioned above for these columns results in the (80) expression. Since the values in the third and the fourth rows in the third column are both "0", the number of errors is proved to be 2, so that this transformation may be finished.

The description mentioned above has been developed with regard to 4 word-correction employing a Reed Solomon code on GF($2^8$), but the present invention is not limited by the Galois field. Furthermore, it is obvious that this invention may be applied to the case of using as a correcting code the other long distance code such as a b adjacent code and correcting more words.

What is claimed is:

1. A method of correcting errors by obtaining a coefficient of each term of an error location polynomial from a syndrome when an error number is n equal to or less than a maximum number table to be corrected by a long distance code in decoding the long distance code, comprising the steps of:

setting data words $A_{(i+j-2)}$ to each element $q_{i,j}$ of a matrix consisting of p rows and (p+1) columns, where $1 \leq i \leq p$, $1 \leq j \leq p+1$;

setting syndromes $S_{(i+j-2)}$ on the basis of the data words $A_{(i+j-2)}$ to each element $a_{i,j}$ of a matrix consisting of n rows and (n+1) columns formed by substituting the error number n for the p;

performing left hand elementary transformation over the matrix; and obtaining said coefficient of each term of said polynomial.

2. A method according to claim 1, wherein said method further comprises the step of adding a row and a column, which respectively contain a "0" for the data words of all the elements, to the matrix without any modification of an element array before performing left hand elementary transformation.

3. A method of correcting errors by obtaining an error pattern corresponding to error locations from error locations and a syndrome when an error number is n equal to or less than a maximum number t table to be corrected by a long distance code in decoding the long distance code, comprising the steps of:

setting data $V_{i,j-1}$ to each element $a_{i,j}$ of a matrix consisting of n rows and (n+1) columns, wherein $1 \leq i \leq n$, $1 \leq j \leq n$;

setting syndromes $S_{i-1}$ on the basis of the data words $V_{i,j-1}$ to each element $a_{i,j}$;

performing left hand elementary transformation over the matrix, and obtaining each error pattern corresponding to the error locations.

4. A device for ocrrecting errors by obtaining a coefficient of each term of an error location polynomial from a syndrome or an error pattern corresponding to error locations from error locations and a syndrome in decoding a long distance code, comprising:

a plurality of memory means $M_{i,j}$ for storing each of data words $A_{(i+j-2)}$ corresponding to each element $q_{i,j}$ of a matrix consisting of p rows and (p+1) columns;

a plurality of buffer means ($D_1$, $D_2$, ... $D_{p+1}$) each connected to each column of said memory means for substituting the the data words; and a plurality of computing means ($C_1$, $C_2$, ... $C_{p+1}$) with Galois field connected to each column of said memory means;

said memory means, said buffer means and said computing means being adapted to process concurrently each of the data words stored in each column in one row of said memory means.

5. A method of correcting errors by obtaining values corresponding to n error locations from an error location polynomial in decoding an error correcting code for correcting a plurality of errors, comprising the steps of:

substituting sequentially each of elements indicating each of locations of received words in a received word train for the error location polynomial, thereby obtaining each value of each term in the error location polynomial whenever each of elements is substituted;

adding each other respective obtained values of the terms till values corresponding to n−1 error locations are obtained on the basis of the elements and the added values of the terms; and calculating a value corresponding to a nth error location on the basis of the values corresponding to the n−1 error locations.

6. A method of correcting errors by obtaining a coefficient of each term of an error location polynominal from a syndrome or an error pattern from error locations and a syndrome in decoding a long distance code by setting data words $A_{(i+j-2)}$ to each element $a_{i,j}$ of a matrix consisting of p rows and (p+1) columns, wherein $1 \leq i \leq p$, $1 \leq j \leq p+1$, performing left side fundamental transformation over the matrix, and obtaining the coefficient of the error correction polynomial or the error pattern, comprising the steps of:

storing the data words $A_{(i+j-2)}$ corresponding to each element $a_{i,j}$ of the matrix consisting of p rows and (p+1) columns in a matrix memory; and processing concurrently each of the data words stored in each row in one column of said memory by using resisters provided in every row and every column of said matrix memory and computing means provided in every row of said matrix memory.

7. A method according to claim 6, wherein each left side fundamental transformation with respect to a (n+1)th to a (p+1)th columns is not performed in a case where all values corresponding to nth to pth (wherein $1 \leq n \leq p$) rows of a nth column are zero after performing the left side fundamental transformation with respect to a nth column.

* * * * *